(12) United States Patent  (10) Patent No.: US 9,225,920 B2
Bluzer  (45) Date of Patent: *Dec. 29, 2015

(54) STARING FOCAL PLANE SENSOR SYSTEMS AND METHODS FOR IMAGING LARGE DYNAMIC RANGE SCENES

(71) Applicant: NORTHROP GRUMMAN SYSTEMS CORPORATION, Falls Church, VA (US)

(72) Inventor: Nathan Bluzer, Rockville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/290,499

(22) Filed: May 29, 2014

(65) Prior Publication Data

US 2014/0267852 A1 Sep. 18, 2014

Related U.S. Application Data

(63) Continuation-in-part of application No. 13/838,245, filed on Mar. 15, 2013, now Pat. No. 8,780,420.

(51) Int. Cl.
H04N 5/355 (2011.01)
H04N 5/378 (2011.01)
H04N 5/374 (2011.01)
H04N 5/372 (2011.01)
H04N 5/359 (2011.01)
H01L 27/146 (2006.01)

(52) U.S. Cl.
CPC .......... *H04N 5/355* (2013.01); *H01L 27/14634* (2013.01); *H01L 27/14636* (2013.01); *H01L 27/14643* (2013.01); *H04N 5/359* (2013.01); *H04N 5/378* (2013.01); *H04N 5/3743* (2013.01); *H04N 5/37206* (2013.01); *H04N 5/37213* (2013.01)

(58) Field of Classification Search
USPC ......................................................... 358/483
See application file for complete search history.

(56) References Cited

U.S. PATENT DOCUMENTS

| | | | |
|---|---|---|---|
| 6,963,669 B2* | 11/2005 | Blosser | G06T 5/20 382/239 |
| 7,221,486 B2* | 5/2007 | Makihira et al. | G06T 7/0004 352/58 |
| 2002/0159647 A1* | 10/2002 | Blosser | G06T 5/20 382/255 |
| 2003/0030853 A1* | 2/2003 | Makihira et al. | G06T 7/0004 358/486 |
| 2004/0011962 A1* | 1/2004 | Chin et al. | 250/370.08 |
| 2005/0087687 A1* | 4/2005 | Bluzer | 250/332 |
| 2006/0118729 A1* | 6/2006 | Chin et al. | 250/370.08 |

* cited by examiner

*Primary Examiner* — Ngon Nguyen
(74) *Attorney, Agent, or Firm* — Tarolli, Sundheim, Covell & Tummino LLP

(57) ABSTRACT

A focal plane staring sensor is provided that includes an M×N sensor, where M is a number of rows of sensor pixels in the sensor and N is a number of columns of sensor pixels in the sensor, where M and N are integers greater than one. A control circuit samples in each sensor pixel value for each sensor pixel of the M×N sensor at a plurality of different integration times corresponding to an amount of time that a photonic charge can be acquired in each sensor pixel of the M×N sensor, wherein the control circuit selects in each sensor pixel one sample from a set of samples to generate a scaled value to facilitate an equalization of a signal to noise ratio between the sensor pixels.

20 Claims, 12 Drawing Sheets

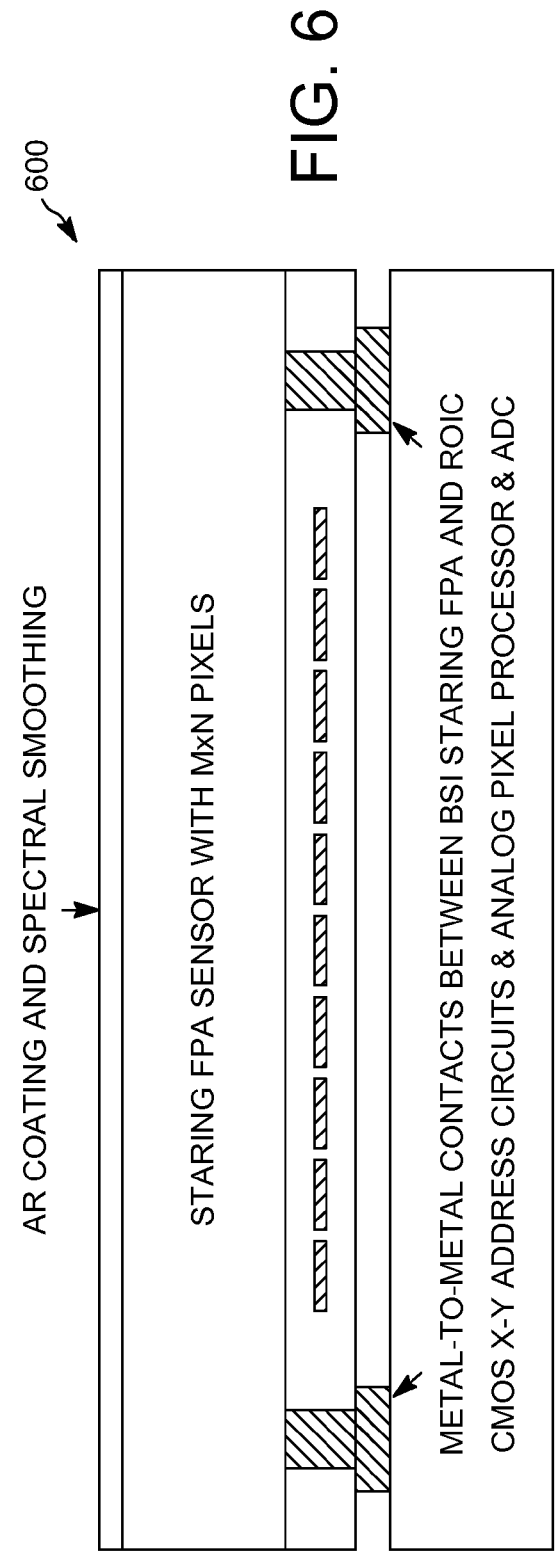

STARING FOCAL PLANE SENSOR SYSTEMS AND METHODS FOR IMAGING LARGE DYNAMIC RANGE SCENES

CROSS-REFERENCE TO RELATED APPLICATION

This application is a continuation-in-part of U.S. patent application Ser. No. 13/838,245 filed on Mar. 15, 2013, and entitled STARING FOCAL PLANE SENSOR SYSTEMS AND METHODS FOR IMAGING LARGE DYNAMIC RANGE SCENES, the entirety of which is incorporated herein by reference.

TECHNICAL FIELD

The present invention relates to focal plane sensors, and more particularly to systems and methods for imaging large dynamic range scenes via staring focal plane sensors.

BACKGROUND

Staring Imaging systems have focal plane sensors operating in different spectral bands (e.g., Ultraviolet (UV), Visible, Short Wavelength Infrared (SWIR), Mid Wavelength Infrared (MWIR), or Long Wavelength Infrared (LWIR)) that have difficulty imaging scenes having large dynamic range where image intensity can vary dramatically across the scene. Object space, or the image scene, can be imaged with focal plane sensors which contain many sensor pixels, where each sensor pixel consists of a photodetector with readout provisions. Focal plane sensors can image a scene by virtually dividing it into small areas where each small area is the footprint of a sensor pixel in object space (or the scene). Large dynamic range scenes contain regions which when imaged with sensor pixels can exhibit very large, or average, or very low photosignals. Characteristically, imaging such scenes has three problems: (i) a sensor pixel's overexposure, or underexposure, (ii) digitization of large dynamic range signals (>15 bits), and (iii) poor sensitivity in overexposed or underexposed sensor pixels. Adjusting globally the integration time to optimize the image according the average scene brightness is not an adequate solution for imaging large dynamic range scenes. The average brightness approach dates from film imaging, and is most effective for low dynamic range scenes, but inadequate for imaging large dynamic range scenes.

Recently, another approach has been introduced for imaging high dynamic range scenes which combines multiple images, each taken at a different exposure. Multiple images are merged with a software program into a single combined image. The combined image merges dim image regions (acquired with the longest exposure) with average brightness image regions (acquired with intermediate exposure) with very bright image regions (acquired with short exposure). Software is used to select sensor pixels with the best exposure (signal to noise ratio) and after proper scaling, the software combines the selected sensor pixels into a single surreal image. The combined image produced from multiple exposures and post processing can be effective for imaging large dynamic range scenes, however, it has serious drawbacks. First, multiple images require more time and are appropriate for slow scenes (e.g., where scene images change slowly on the sensor from frame-to-frame), and not faster scenes. Second, combining multiple images requires sensor pixel to sensor pixel registering in multiple images, otherwise blurring can occur. These additional requirements limit the utility of the multiple image approach to situations where: (1) a tripod is used for adequate stability between the camera and scene, and (2) the scene does not change rapidly.

The problem of imaging large dynamic range scenes is illustrated by the example in TABLE 1. The scene's dynamic range entered in the second column is divided into five subranges. Such division illustrates several characteristics of imaging with focal plane sensors containing quantum photodetectors with readout provisions. First, signals from large dynamic range scenes have photosignals which vary over a wide dynamic range (see column 2 in TABLE 1) and the signal to noise ratio varies according to Poisson statistics as the square root of the signal (see column 3 in TABLE 1). Poor sensitivity occurs because the S/N decreases monotonically as the square root of the signal. At the highest signal levels, sensor pixel saturation can occur and this can lead to poor sensitivity. Second, sensitivity dependence of a sensor pixel's photosignal complicates digitizing signals from large dynamic range scenes. Typically, an analog-to-digital (A/D) convertor's least significant bit (LSB) is adjusted to equal approximately the signal's noise level. It is difficult to define a global LSB value for an imaging focal plane sensor because each sensor pixel's noise varies with the photosignal (see column 3 in TABLE 1). This would require varying the A/D LSB for each range (see column 5 in TABLE 1) which raises many complications.

Conventionally, the A/D converters LSB is set at the minimum noise level and that causes inefficient A/D converter operation since significant time is consumed digitizing noise. Third, in large dynamic range images, the signal-to-noise (S/N) ratio is maximum in scene regions with high photosignals and minimum in regions with low photosignals (see column 4 in TABLE 1). This effect translates into noticeable variation in image quality where the best (poorest) image quality is in regions where the sensor pixels have high (low) level photosignal.

TABLE 1 below is an example of the signal levels expected in a focal plane sensors with quantum photodetectors. Each sensor pixel is subjected to the same integration time and field of view. After one integration time, the integrated charge photosignal in each sensor pixel is assumed to vary between 12 and 12,500 photoelectrons. The signal's dynamic range has been divided into five subranges to illustrate how a sensor pixel's noise and S/N ratio varies with signal (see, respectively, third and fourth columns). Digitizing signals with different noise levels complicates selecting an optimal value for the A/D converter's LSB value.

TABLE 1

| Signal Range # | Unscaled Signal Range (electrons) | Unscaled Noise Range (electrons) | Instantaneous S/N (# Bits) Before Scaling | Unscaled A/D Converter LSB (electrons) |
| --- | --- | --- | --- | --- |
| 1 | 3,125-12,500 | 56-112 | <8 | 30 |
| 2 | 782-3,125 | 28-56 | <6 | 15 |
| 3 | 196-782 | 14-28 | <5 | 7 |
| 4 | 49-196 | 6-14 | <4 | 3 |
| 5 | 12-49 | 3-7 | <3 | 1.5 |

SUMMARY

In accordance with one example, a focal plane staring sensor is provided that includes an M×N sensor, where M is a number of rows of sensor pixels in the sensor and N is a number of columns of sensor pixels in the sensor, where M and N are integers greater than one. The M×N sensor employs at least two integration wells to acquire photonic charge for each sensor pixel for a present frame and to store photonic charge for each sensor pixel from a previous frame. Each sensor pixel includes a photodetector and readout circuit which can be made from the same semiconductor material. During each imaging frame, a control circuit samples several times the value of each sensor pixel of the M×N sensor at a plurality of different integration times corresponding to an amount of time that a photonic charge can be acquired in each sensor pixel of the M×N sensor, wherein the control circuit selects one sample from a set of samples from each sensor pixel to generate a scaled value to facilitate an equalization (approximately within 2 times) of a signal to noise ratio between the sensor pixels. The control circuit switches between the two integration wells of the M×N sensor to acquire photonic charge for the present frame in one of the integration wells and enables readout of the stored photonic charge from the previous frame from the other of the integration wells. Digitization of the scaled sensor pixel values captures the equalized (within approximately 2 times) signal to noise ratio, and this is followed by digitally unscaling each sensor pixel, by its scaling factor, to recover the original values before scaling, while maintaining an equalized signal to noise ratio within two times.

In accordance with another example, a focal plane staring sensor is provided. This includes an M×N sensor, where M is a number of rows of sensor pixels in the sensor and N is a number of columns of sensor pixels in the sensor, where M and N are integers greater than one. The M×N sensor employs at least two integration wells to acquire photonic charge for each sensor pixel for a present frame and to store photonic charge for each sensor pixel from a previous frame. Each sensor pixel includes a photodetector and simple readout circuit which are made from different semiconductor material. During each imaging frame, a control circuit samples several times for a value of each sensor pixel of the M×N sensor at a plurality of different integration times, and the control circuit selects one sample from a set of samples from each sensor pixel to generate a scaled value to facilitate an equalization (approximately within 2 times) of a signal to noise ratio between the sensor pixels. The control circuit switches between the two integration wells of the M×N sensor to acquire photonic charge for the present frame in one of the integration wells and enables readout of the stored photonic charge from the previous frame from the other of the integration wells. Digitization of the scaled sensor pixel values captures the equalized (within approximately 2 times) signal to noise ratio, and this is followed by digital unscaling of each sensor pixel, by its scaling factor, to recover the original values before scaling, while maintaining an equalized signal to noise ratio within 2 times.

In yet a further example, a method comprising includes switching a first integration well for an M×N sensor to acquisition mode and a second integration well for the M×N sensor to readout mode. The method includes integrating charges for a present frame in the first integration well and digitizing charges stored from a previous frame from the second integration well while the present frame is acquired in the first integration well. The method includes switching the first integration well to readout mode and the second integration well to acquisition mode. This includes integrating charges for the present frame in the second integration well and digitizing charges stored from the previous frame from the first integration well while the present frame is acquired in the second integration well.

BRIEF DESCRIPTION OF THE DRAWINGS

FIGS. 5 and 6 illustrate example Focal Plane Arrays (FPA) and Read-Out Integrated Circuits (ROIC).

DETAILED DESCRIPTION

Figure 1:
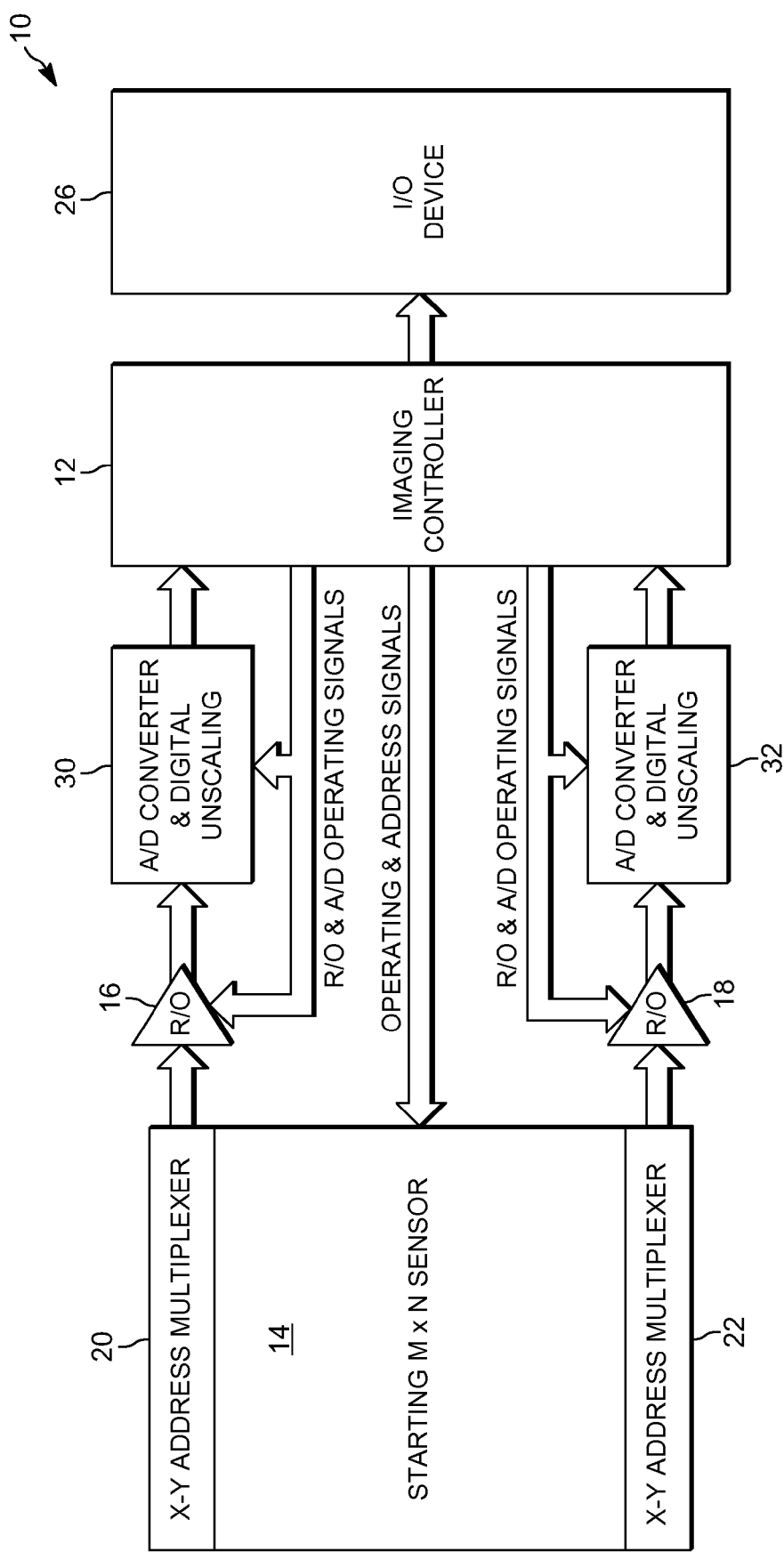
FIG. 1 illustrates an example of a functional block diagram of a staring imaging system.

The present disclosure provides a focal plane sensor architecture, system, and methods for imaging large dynamic range scenes. This includes providing images with substantially equalized inter sensor pixel signal-to-noise (S/N) ratios (e.g., within 2 times) irrespective of the brightness value of each sensor pixel's footprint in object space. Equalization can be achieved by applying a digital transformation to each sensor pixel's acquired photosignal to substantially equalize each sensor pixel's photosignal within a similar brightness range and S/N ratio. The digital transformation adjusts each sensor pixel's integration time by a scaling factor which depends on a sensor pixel's initial photosignal brightness thereby mapping each sensor pixel's photosignal into a predetermined sensor pixel signal range. This substantially equalizes the S/N ratio of each sensor pixel's photosignal value to within about two times of one another and thus improving overall image quality.

Based on the scaling factor, each sensor pixel's integration time is adjusted by a control circuit that samples the value of each sensor pixel of the sensor at a plurality of different integration times corresponding to an amount of time that a photonic charge can be acquired or integrated in each pixel of the sensor. The control circuit selects one sample from a set of samples to generate a scaled value to facilitate an equalization of a signal to noise ratio between the sensor pixels. The scaled sensor pixel value is then converted by the control circuit from an analog signal to a digital signal, thus capturing the optimized S/N ratio for each pixel in the sensor. The digital scaled sensor pixel value is then digitally unscaled by its respective scaling factor (stored for the selected sample) to recover the sensor pixel's original brightness signal while maintaining the digitally captured and equalized inter sensor pixels S/N ratio.

The aforementioned digital transformation for high dynamic range imaging governs the operation and digitization of each sensor pixel in the focal plane sensor. The digital transformation satisfies at least two practical constraints including: (1) Each sensor pixel's output signal value (neglecting global gain factors and quantization errors) remains unchanged, and (2) scaling equalizes the inter sensor pixels' signal to noise ratios approximately to within 2×. The first constraint provides that the digital transformation does not distort the image. Hence, unscaling is performed, as part of the digital transformation, to recover and obtain a digital representation of each sensor pixel's initial photosignal value (neglecting global gain factors). This does not preclude using compression algorithms to process the high dynamic range digital images for displaying on limited dynamic range displays, for example. The second constraint equalizes (within approximately 2×) inter sensor pixels' sensitivity and thereby facilitates optimal S/N ratios in sensor pixels with small, average, and/or large photosignals.

FIG. 1 illustrates an example of a functional block diagram of a staring imaging system 10. The staring imaging system 10 includes an imaging controller 12 configured to control the staring imaging system 10 and capture and process sensor pixel values of images corresponding to object space or scenes. Each sensor pixel captures a brightness signal from the footprint of the detector's projection into object space or scene. The staring imaging system 10 includes an M×N staring imaging sensor 14 having a plurality of sensor pixels, wherein each sensor pixel can be addressed according to M rows and N columns, where M and N are integers greater than one. Each cell of the sensor 14 includes a photon detection element (a detector) that receives photons and converts the photons into electrical charge for injection into an integration well of a Read Out Integration Circuit (ROIC) within the sensor pixel. Electrical signals from sensor pixels can be readout via an amplifier readout (R/O) before being digitized by an A/D converter 30. For additional processing speed, multiple additional ROIC's 18 can be provided to access sensor pixels with X-Y addressed multiplexers (shown at 20 and 22) associated with the sensor 14. The imaging system 10 can include an input/output device 26 that receives image results from the imaging controller 12. The input/output device 26 can also provide synchronization inputs of the imaging system relative to the object space or scene, such as height, distance, speed or other parameters for synchronizing operation of sensor 14 relative to the object space of scene.

The imaging controller 12 can be used to determine signal ranges for the sensor pixels according to a histogram of the sensor pixels' signal ranges obtained from initial photosignal values, and a scaling factor that adjusts each sensor pixel's integration time so that each sensor pixel's photosignal value falls within a predetermined sensor pixel signal range (e.g., brightest sensor pixel's signal range). Analog voltage signals from the sensor pixels are then provided to an A/D converter and Digital unscaling stage at 30 and 32 that digitizes and unscales the analog voltage from the sensor 14 to recover the sensor pixel's original signal with equalized S/N ratio. The final image is then provided to the input/output device 26 (e.g., camera, cell phone), for example, to be displayed.

The imaging controller 12 can be provided as an integrated control circuit that samples a sensor pixel value for each sensor pixel of the M×N sensor 14 at a plurality of different integration times corresponding to an amount of time that a photonic charge can be acquired in each sensor pixel of the M×N sensor. The control circuit 12 then selects one sample from a set of samples to generate a scaled value to facilitate an equalization of a signal to noise ratio between the sensor pixels. The system 10 can include at least one readout circuit 16/18 configured to enable readout of each sensor pixel of the M×N sensor to be acquired and to generate a signal for each sensor pixel representing the photonic charge acquired in each sensor pixel.

As will be described below, depending on the underlying sensor technology, various embodiments of sensor 14, ROIC circuits 16 and 18, AD converters 30 and 32, and imaging controller 12 are possible. For example, for visible and UV sensors 14 that can be implemented in silicon having silicon photodetectors, the ROIC 16 and 18 can be integrated within the sensor 14 (See e.g., FIG. 7). In an infrared application having a sensor in a different type of material, the ROIC and stages 16 and 18 can be implemented in a different technology, preferably silicon, from that of the sensor (e.g., See FIG. 9). For high speed frame capture applications, elements of the ROIC and readout stages 16/18, the unscaling circuits at 30 and 32, and portions of the imaging controller 12 can be included along with each sensor pixel of the sensor 14 array, to facilitate parallel implementation of optimal integration times for each sensor pixel and associated scaling values for each sensor pixel. Such parallel sensor pixel processing greatly improves the rate at which image frames can be obtained and captured with the sensor 14.

Figure 2:
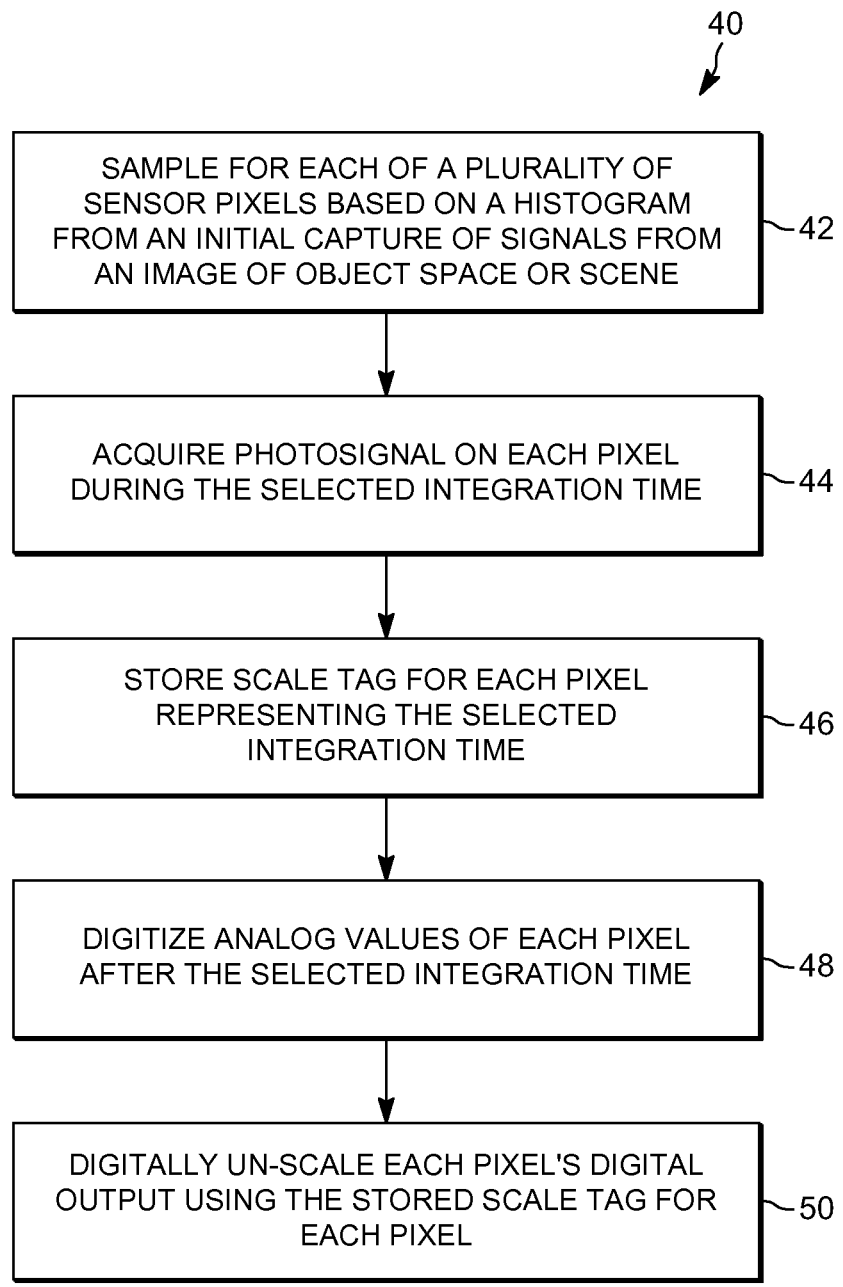
FIG. 2 illustrates an example method for capturing an image of object space (or scene) with a focal plane sensor.

FIG. 2 illustrates an example method 40 for capturing an image in object space (or scene) with a staring focal plane sensor. The methodology begins at 42 where an initial photosignal value is determined by sampling for each of a plurality of sensor pixels based on a histogram from initial capture signals from an image of object space or scene. Based on the photosignal values at 42, an integration time can be selected where longer integration times are selected for dimmer sensor pixels and shorter integration times are selected for brighter sensor pixels as determined with a histogram produced from the initial image capture at 42. At 44, each sensor pixel acquires charge during its selected integration time from 42. At 46, a scaling tag is stored for each pixel that represents how long the given sensor pixel was integrated. Such scaling tag can be an integer value such as 1, 4, 16, 64, 256, and so forth representing integration times of 1×, 4×, 16×, 64×, and 256× respectively. At 48, the analog voltages of each integrated sensor pixel are digitized to provide scaled digitized sensor pixel values for each of the plurality of sensor pixels, and capture the equalized (within approximately a factor of two) signal to noise ratio. At 50, each digitized sensor pixel value is digitally unscaled by its determined scale factor (e.g., tag) for each of the plurality of sensor pixels to recover each sensor pixels initial photosignal value. For example, an unscaling can include digitally reducing a digitized signal's brightness by dividing shifting its scaled value by the scaling tag as shown below with respect to FIG. 4.

In accordance with one example, five signal ranges have been assigned to sensor pixels' signal values that span from 12 electrons, for the dimmest signals, up to 12,500 electrons, for the brightest signals. Each signal, falling within one of the four lower level signal ranges, is scaled up by variable integration time per pixel into the highest (brightest) sensor pixel signal range. Accordingly, the integration time is increased by varying the time charge can accumulate on each sensor pixel to correspond to the scaling factors illustrated in TABLE 2 below.

TABLE 2

| Pixel's Signal Range | Pixel's Signal Range (electrons) | Pixel's Noise Range (electrons) | Pixel's S/N Ratio | $4T_{INT}$ Signal Scaling (electrons) | $16T_{INT}$ Signal Scaling (electrons) | $64T_{INT}$ Signal Scaling (electrons) | $256T_{INT}$ Signal Scaling (electrons) |
|---|---|---|---|---|---|---|---|
| 1 | 3,125-12,500 | 56-112 | 56-112 (7 Bits) | 12.5k-50k | 50k-200k | 200k-800k | 800k-3.2M |
| 2 | 782-3,125 | 28-56 | 28-56 (6 Bits) | 3.125k-12.5k | 12.5k-50k | 50k-200k | 200k-800k |
| 3 | 196-782 | 14-28 | 14-28 (5 Bits) | 782-3.125k | 3.125k-12.5k | 12.5k-50k | 50k-200k |
| 4 | 49-196 | 6-14 | 6-14 (4 Bits) | 196-782 | 782-3.125k | 3.125k-12.5k | 12.5k-50k |
| 5 | 12-49 | 3-7 | 3-7 (3 Bits) | 48-196 | 196-782 | 782-3.125k | 3.125k-12.5k |

The first four columns in TABLE 2 correspond to the first four columns in TABLE 1, where all entries are calculated for the same integration time TINT, which corresponds to a 1× scaling. Columns 5, 6, 7, and 8 have been calculated assuming a sensor pixel's integration time was scaled, respectively, by 4×, 16×, 64× and 256×. Each one of the five Signal Ranges in column 2 can be equalized to Signal Range #1 by using the proper scaling factor: Signal Range #2 is scaled by 4×, Signal Range #3 is scaled by 16×, Signal Range #4 is scaled by 64×, and Signal Range #5 is scaled by 256×. Such scaling maps all signals into Signal Range #1 and thereby equalizes all the sensor pixels' S/N ratio within approximately 2 times.

In TABLE 2, columns 5, 6, 7, and 8 have been calculated for scaling a sensor pixel's integration time by 4×, 16×, 64× and 256, respectively. Arbitrary scaling a sensor pixel's integration time can lead to saturation. Scaling all sensor pixels' into Signal Range 1 by 16× will result in saturation sensor some sensor pixels. Similarly, scaling sensor pixels in Signal Range 2 (3) by 64× (256×) will also result in sensor pixel saturation. However, by selectively applying different scaling to each the five Signal Ranges listed in TABLE 2 will map all the signals into Signal Range #1 and thereby equalize the inter sensor pixels' S/N ratio in all the 5 Signal Ranges. Such a mapping is performed by scaling the four lower Signal Ranges (#2, #3, #4 & #5) by (4×, 16×, 64×, and 256×), respectively, into the Signal Range #1. Such a mapping is shown in TABLE 3, column 6 below.

approximately within 2 times. Furthermore, scaling simplifies digitization of sensor pixels' signals from large dynamic range scenes.

Figure 3:
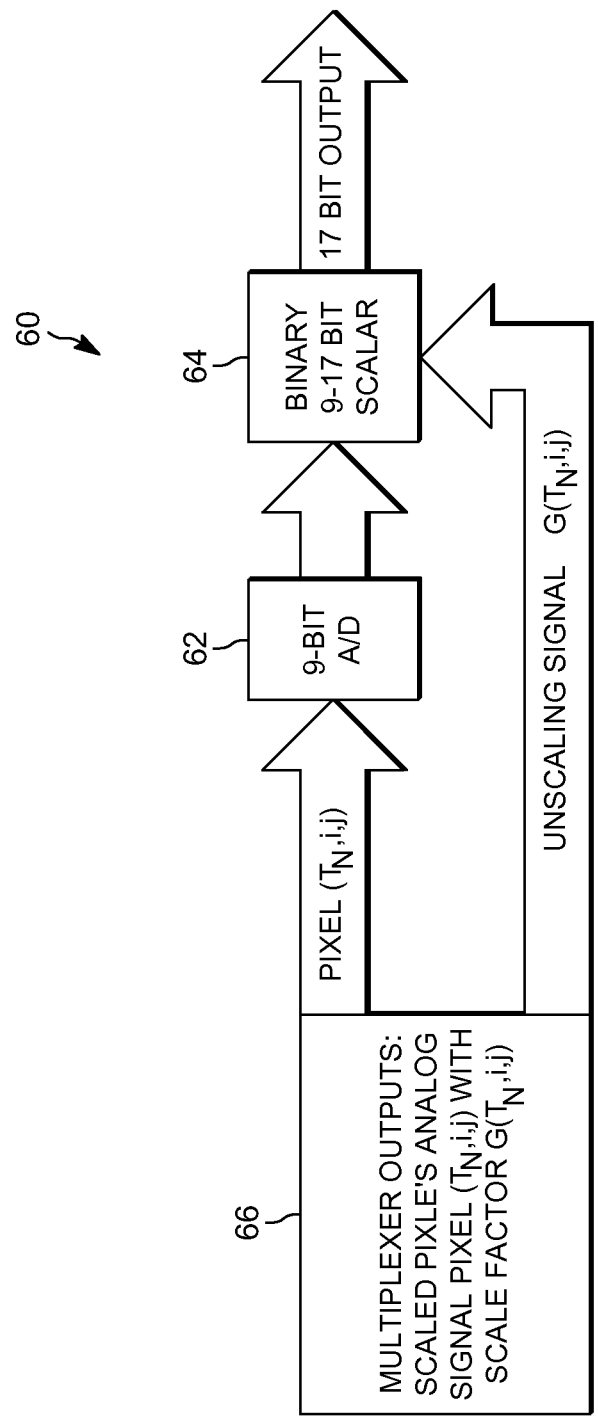
FIG. 3 illustrates an example functional block diagram of an A/D converter and digital unscaling stage.
Figure 4:
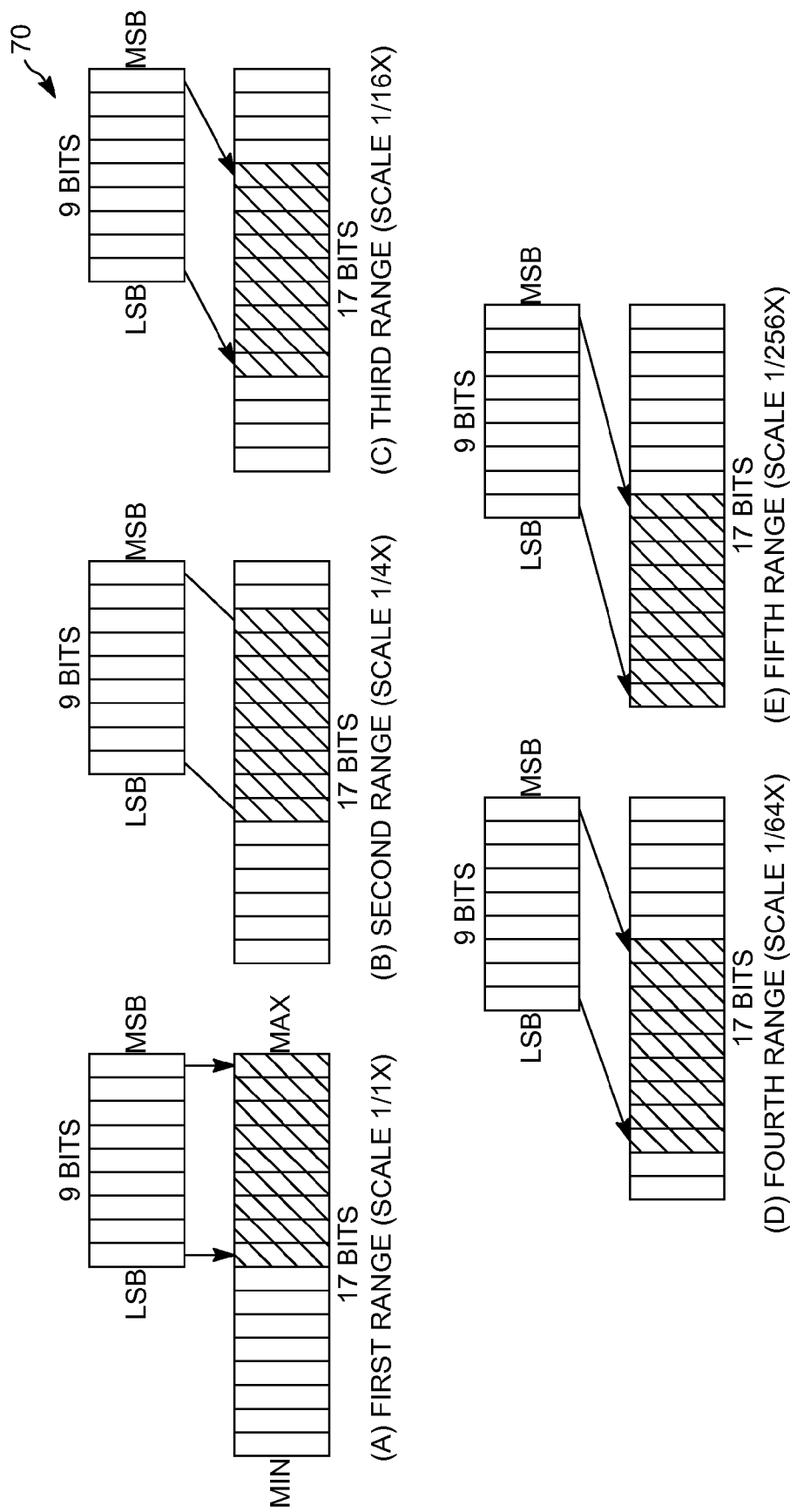
FIG. 4 shows a block diagram of an example register illustrating operations of a digital unscaling arithmetic unit.

As previously stated, the digital transformation technique allows for utilization of an A/D converter with less bits compared to the number of bits needed without employing the digital transformation technique. FIG. 3 illustrates an example functional block diagram of an A/D converter and digital unscaling stage with five sensor pixel signal ranges as illustrated in TABLE 2 and TABLE 3. FIG. 3 illustrates how a conventional 9 bit A/D converter is sufficient to provide a 17 bit digital output by incorporating an 8 bit digital unscaling unit 64 that operates on every sensor pixel. A multiplexer 66 operating on a M×N sensor, in FIG. 3, generates outputs signals from each sensor Pixel($T_N$,i,j) into an A/D converted 62 which digitizes each sensor pixel's analog output with 9 bit. Where variable "$T_N$" represent the sensor pixel sampling time, index "i" represent the row number from 0 to M, and index "j" represent the column number from 0 to N. The 9 bit A/D converter 62 output its digitally unscaled value with the digital unscaling unit 64 according to a sensor pixel's scale tag G($T_N$,i,j), which represents the scaling factor that each sensor pixel has received. FIG. 4 shows a block diagram of an example register that illustrating how digital unscaling is incorporated with the 9 bit A/D, for various scale ranges. Here, the digital unscaling arithmetic unit acts as a divider to remove the effects of scaling (1×, 4×, 16×, 64×, or 256×)

TABLE 3

| Signal Range | Un-scaled Signal Range (electrons) | Un-scaled Noise Range (electrons) | Instantaneous S/N (#Bits) Before Scaling | Linear Scale Factor | Scaled Signal Range (electrons) | Instantaneous S/N (# Bits) | Scaled A/D Converter LSB (electrons) |
|---|---|---|---|---|---|---|---|
| 1 | 3,125-12,500 | 56-112 | <9 | 1X | 3,125-12,500 | <9 | 30 |
| 2 | 782-3,125 | 28-56 | <8 | 4X | 3,125-12,500 | <9 | 30 |
| 3 | 196-782 | 14-28 | <7 | 16X | 3,125-12,500 | <9 | 30 |
| 4 | 49-196 | 6-14 | <6 | 64X | 3,125-12,500 | <9 | 30 |
| 5 | 12-49 | 3-7 | <5 | 256X | 3125-12,500 | <9 | 30 |

The digital transformation maps five Signal Ranges (column 2, TABLE 3) into a single range between 3,125 and 12,500 electrons (column 6, TABLE 3). This accomplishes two aspects: it equalizes the S/N ratio for all sensor pixels to within approximately 2 times, and simplifies A/D conversion by equalizing the LSB (see column 8, TABLE 3). Equalization is achieved with scaling which adjusts each sensor pixel's integration time to map all the five Signal Ranges into one range between 3,125 and 12,500 electrons. Since each sensor pixel's signal obeys Poisson statistics, the mappings equalizes the signal-to noise ratio within the five scene regions. Equalizing the inter sensor pixels' S/N ratios results in bright, average, and dim sensor pixels with the same S/N ratios, applied to each sensor pixel's to equalize the S/N ratio within approximately 2 times. This is facilitated by carrying each "sensor pixel's" scale factor tag representing each sensor pixel's amplitude and the same tag that provides information that is needed to perform a sensor pixel's unscaling.

The A/D architecture shown in FIGS. 3-4 can be designed to provide a 17 bit digital output with a nine bit A/D converter coupled to an 8 bit digital unscaling unit in one example. A nine bit A/D converter is suitable because the sensor pixels' signals located within five signal ranges before scaling are all mapped into the first signal as represented in column 6, TABLE 3, and the instantaneous S/N range after scaling is less than 9 bits. Additionally, this mapping, implemented by pixel can be digitized with a nine bit A/D, while preserving the improved S/N ratios. This digital transformation is completed by digitally unscaling each sensor pixel's 9 bit digital signal with, for example, an 8 bit scale tag assigned to each sensor pixel. The scale tag assigned to each sensor pixel represents the scale factor (1×, 4×, 16×, 64×, or 256×) used to equalize the S/N ratio (within approximately two times) by mapping five Signal Ranges into one. Division by the modulo "2" sensor pixel's scale tag value is readily performed by shifting the 9 bit A/D output down into a 17 bit output register. The 9 bit sensor pixel's output is shifted to the left based on sensor pixel's scale tag, as is illustrated in FIG. 4.

This digital transformation method presented applies to a focal plane sensor intended for staring and scanning systems imaging high dynamic range scenes. It applies to imaging focal plane sensor using quantum detectors operating in different spectral bands, including: UV, visible, SWIR, MWIR, and LWIR. However, the embodiment of the digital transformation depends on the focal plane sensor's operating spectral band, wherein various embodiments are illustrated and described below depending on the given operating spectral band.

FIGS. 5 and 6 illustrate two examples of staring Focal Plane Arrays (FPA) attached to Read-Out Integrated Circuits (ROIC) 500 and 600. To implement variable Integration Time per Pixel, a large number of interconnects can be provided between the staring Focal Plane Arrays (FPA) sensor and associated Read-Out Integrated Circuits (ROIC). This can be implemented using flip-chip or wafer bonding between the FPA and ROIC, as shown in FIGS. 5 and 6. Such hybridization technology offers higher interconnect density than thermal compression gold wire bonding; which utilize bonding pads which are about 100 µm square, for example. The flip-chip technology reduces the size of interconnects pads to as little as 5 µm×5 µm, for example. Further reduction in interconnect metal pads can be provided with wafer bonding. These hybridization techniques make possible Back Side Imaging (BSI) hybrid sensors as described below.

Hybrid BSI sensors provide more flexibility and performance benefits including independent process optimization for staring FPA and ROICs. This includes optimization of the BSI staring FPA that also include quantum efficiency maximization. Independent fabrication of the ROIC allows using standard low cost CMOS foundry, and inclusion of CMOS X-Y address circuits & Analog Processors and digitization ADC for example. Other features include Back side Imaging (BSI) that allows doubling the optical absorption length by using reflective interconnects & gates. This improves quantum efficiency, Modulation Transfer Function (MTF) and reduces the BSI FPA's operating voltages, for example. Yet another feature includes Hybridization with flip-chip or wafer bonding for direct metal-to-metal contact allows direct physical/electrical access between the ROIC and each pixel in the stating FPA. This facilitates pixel readout and adjusting each pixel's integration time as described below.

Figure 7:
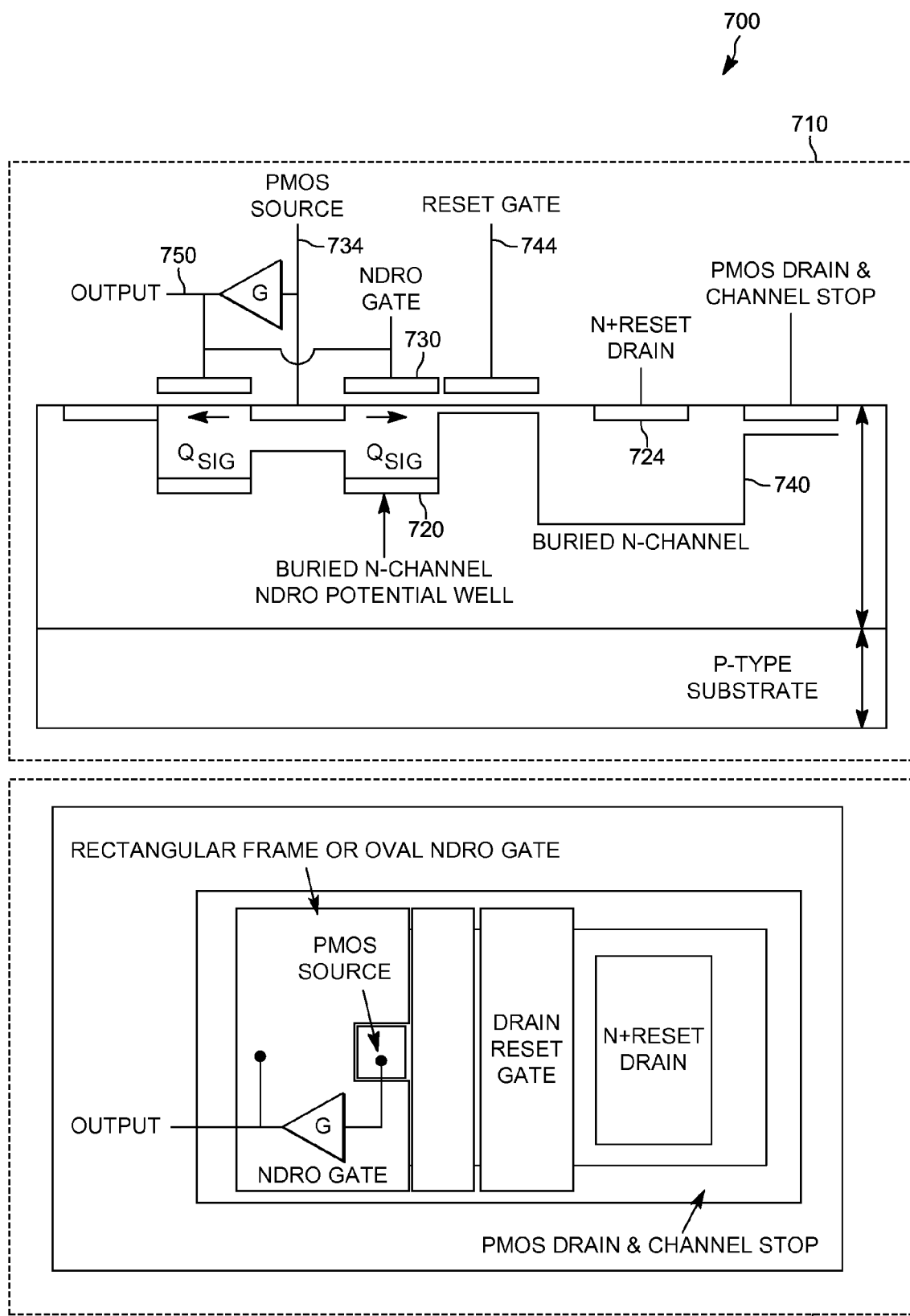
FIG. 7 illustrates an example of an M×N structure of a Focal Plane Array for imaging visible and ultraviolet spectrums.

FIG. 7 illustrates an example of a sensor pixel 700 from a staring Focal Plane Array with M×N sensor pixels intended for imaging visible and ultraviolet spectrums. A profile view of one sensor pixel structure in 700 is shown at 710 and a top view of the sensor pixel structure in 700 is shown at 712. The sensor pixel structure 700 is assembled into staring M×N sensor FPA designed for Back Side Imaging (BSI). A non-destructive readout (NDRO) structure 700 can be used for nondestructively reading out the charge integrated in an NDRO potential well at 720. An amplifier labeled "G" can be included to increase charge to voltage conversion gain of the NDRO readout. In other examples, the amplifier may not be included. In a 2D M×N sensor FPA array, the sensor pixel cell can be adjusted to maximize packing density by sharing a reset drain 724 and the interconnections amongst several adjacent sensor pixel cells.

One approach to large dynamic range staring sensors is possible for UV and Visible sensors. Since these sensors can have silicon photodetectors, some pixel readout circuitry can be included in the staring FPA portion, for example see FIGS. 5 and 6. The staring FPA sensor, featuring variable integration time per sensor pixel, can be made up of a two dimensional array of photosensitive sensor pixel cells as shown in the structure 700. Signal from the BSI staring FPA is optically injected into the buried channel Non-Destructive-Read-Out (NDRO) potential well 720, located under an NDRO rectangular gate 730, with a hole for a PMOS source node 734. Large dynamic range (e.g., 16-17 bit) imaging (mechanized with the digital transformation) can be enabled by adjusting each pixel's integration time to 1, 4, 16, 64, or 256 time increments, depending on the histogram of all the pixels' brightness initially captured with the M×N sensor from a given scene and used for determining the overall signal range and five subranges. Each sensor pixel's brightness after integration time scaling is represented by Pixel($T_N$,i,j) where "i", "j", and "$T_N$" represent, respectively, row, column, and sensor pixel sample time. The associated integration time scaling factor for each sensor pixel is represented by a scaling tag G($T_N$,i,j). Mechanizing variable integration time per sensor pixel can include several functions in each detector cell and these can include the following:

Each detector cell can include a buried channel 740 for integrating photogenerated charge from photons incident on the back side of the staring M×N FPA array. Electric fields funnel charge photogenerated in the substrate and n-buried channel into an n-type buried channel potential well 720 formed under a Non-Destructive-Read-Out (NDRO) gate 730, with a source 734 in the center. Photogenerated charges are confined laterally in the NDRO well by p-type channel stops on three sides and a reset gate 744 on the fourth side. The reset gate 744 periodically empties charge inside the NDRO potential well 720 into the N+ reset drain 724. The reset gate 744 doubles as an anti-blooming gate to prevent charge overflow. The reset gate 744 is also used to adjust or scale each sensor pixel's integration period.

The integration period varies between 1 and 256 units, for example, where a unit is a time increment defined by how fast the staring M×N sensor FPA images. Each sensor pixel's integration period is individually adjusted according to the photon flux and can equal: 1, 4, 16, 64, or 256 time units, for example. The integration time choices are incremented by 4× and this corresponds to increasing the noise by 2×. Combining per sensor pixel integration time scaling with a 9 bit A/D convertor yields a constant LSB which facilitated digitization to each sensor pixel's output signal to 17 bits. Sensor pixels imaging very bright (dim) scenes will undergo minimum (maximum) integration time with 1 (256) time units. Sensor pixels imaging scene with intermediate brightness will have integration times between 4 and 64 time units, for example.

Photosignal charge readout in the NDRO potential well 720 is with the NDRO readout structure, albeit a conventional readout can also be used. The NDRO structure shown at 710 consists of a PMOS device with a drain formed by the p+ channel stops and a source formed by a p+ located in the center of the NDRO gate 730. The NDRO PMOS operates as a source follower circuit whose output signal is modulated by the charge integrated in the NDRO potential well 720. An NDRO output 750 is based on the modulation of the PMOS n-body potential by the charge in the buried potential well 720. Operation of the PMOS variable integration time sensor can be mechanized with the attached ROIC, which includes the amplifier with gain "G" less than one, CMOS X-Y address circuits & analog processor/ADC.

Operation of Staring Digital Sensor with Variable Integration Time per sensor pixel can be mechanized in several steps. The sensor pixels in a two dimensional M×N array are labeled PIX($T_N$ i, j), where variables "i", "j", and "$T_N$" represent, respectively, row, column, and sensor pixel sample time. Initially, all the sensor pixels are sampled with the a short integration time to generate a histogram from which the overall signal range and five subranges can be determined and used to determine the proper variable integration time TINT($T_N$, i, j) with a scaling tag G($T_N$, i, j) used for assigning [1, 4, 16, 64, or 256] units of integration to each sensor pixel. Since sensor pixels' readout is with a nondestructive readout, it is possible to sample each sensor pixel twice (with and without signal) and thereby remove 1/f noise. To speed up operation, many sensor pixels can be readout in parallel, for example, by having one or multiple readouts for each row, or column. Also, each sensor pixel can be readout with no signal to establish the dc offset and 1/f noise level of the readout structure. These are subtracted from the readout signal taken at five different integration times. Removing the dc offset and 1/f noise is facilitated by the fact that the NDRO does not generate reset noise.

Accommodating five possible integration times [e.g., 1, 4, 16, 64, or 256] per each sensor pixel will employ five readouts of the staring M×N array. The array's readout sequence starts with the shortest integration time, and this is followed by a successive readout for longer integration times. The longest integration time readout is last. Variations in the integration time due to time delays from ROIC x-y addressing and readout duration can be corrected with digital unscaling and sensor pixels' resets between readouts. Digital unscaling corrects for differences in per sensor pixel's integration time. Known delays from x-y address and readout can be included with the integration time scaling factor G($T_N$, i, j). Reset between readouts can minimize delay effects from x-y address and sensor pixel readout circuits especially at shorter integration times per sensor pixel.

Digitization of Large Dynamic Range Signals is facilitated with variable integration time per sensor pixel according to the photogenerated signal amplitude. Such scaling is superior to voltage scaling because: (1) it simplifies the design of the A/D converter, and (2) improves the signal to noise ratio by the square root of the value of increased integration time. Unscaling captures the improved signal to noise ratio and recovers a digital representation of each sensor pixel's original analog brightness amplitude.

Figure 8:
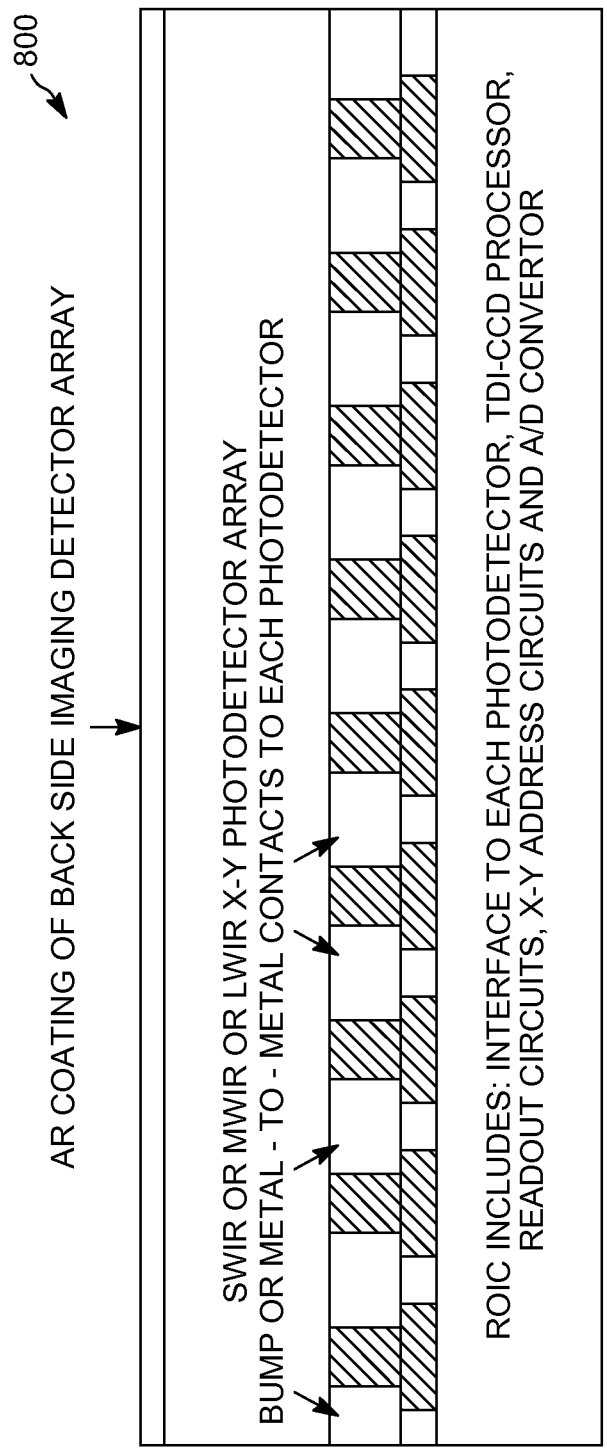
FIG. 8 illustrates an example Focal Plane Array and ROIC structure to image infrared (IR) spectral bands.

FIG. 8 illustrates an example Focal Plane Array and ROIC structure 800 to image infrared (IR) spectral bands. Each SWIR, MWIR, or LWIR, photodetector focal plane array can be connected by Wafer Bonding or Indium Bump Bonding to the ROIC. For maximum fill factor, the SWIR or MWIR, or LWIR photodetector array can be AR coated and operates in Back-Side-Imaging (BSI) mode. The SWIR, or MWIR, or LWIR ROIC also includes a direct injection (DI) electrical interface circuits to each photodetector and circuits for variable integration time for each photodetector. Unlike UV and Visible staring FPA made in Silicon as described above with respect to FIGS. 5-7, intrinsic SWIR, MWIR or LWIR photodetectors are typically constructed in InGaAs (for SWIR) InSb or HgCdTe (for MWIR) and HgCdTe (for LWIR), for example. The technology in these materials is not sufficiently developed to include portions of the ROIC circuits in the detectors' intrinsic FPA material. Thus, for SWIR, MWIR & LWIR Staring Sensor with Variable Integration Time per Sensor Pixel, the electrical circuits associated with every detector are in the ROIC as will be illustrated and described below with respect to FIG. 9. Photosignals from SWIR, MWIR, or LWIR photodetectors are electrically (not optically as with UV and Visible photons) injected into the silicon ROIC with an injection structure as described below.

Figure 9:
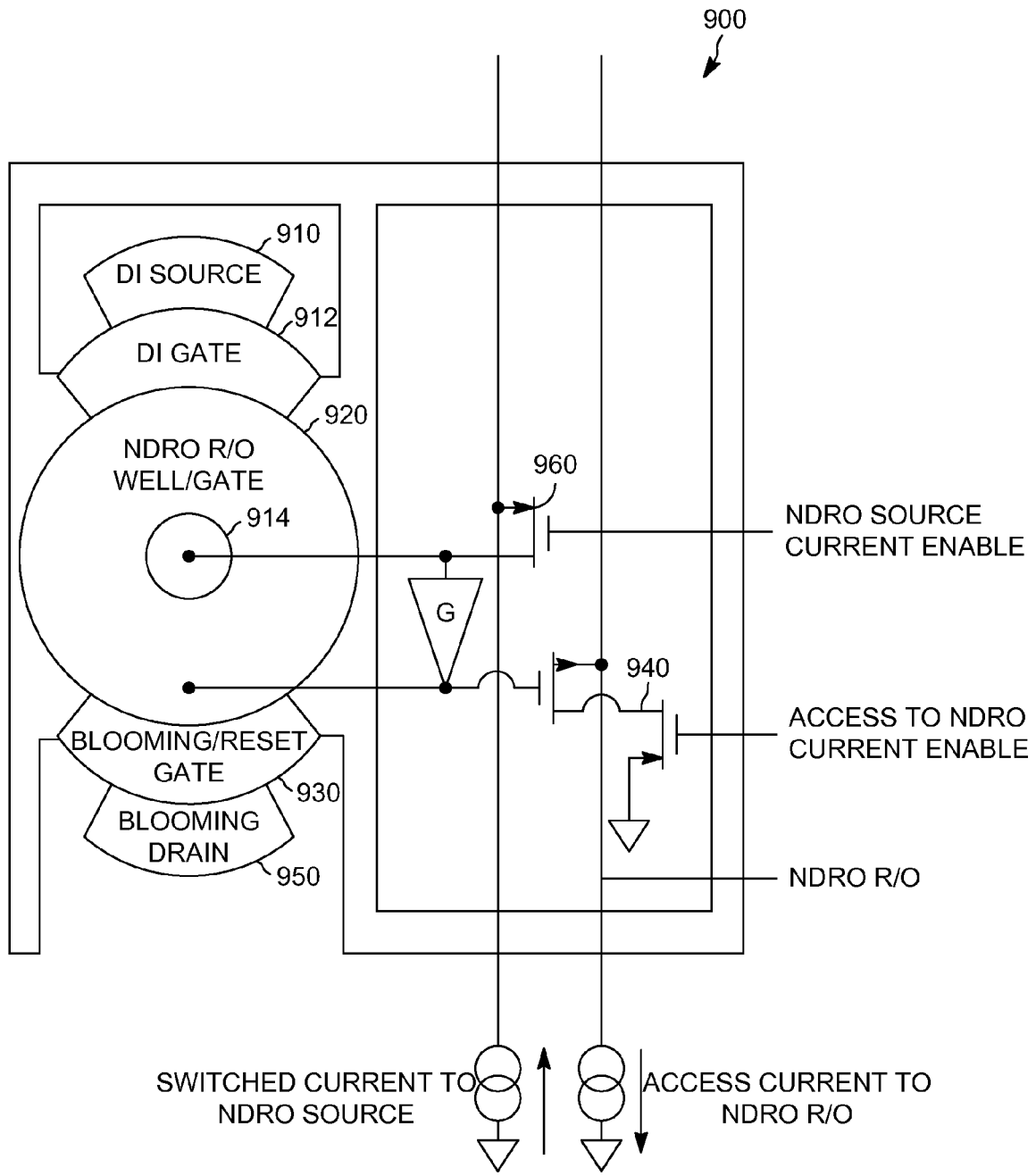
FIG. 9 illustrates an example sensor pixel in an M×N FPA array having a readout cell for mechanizing variable integration time per photodetector.

FIG. 9 illustrates an example of a sensor pixel (with photodetector not shown for clarity) readout cell 900 in an M×N FPA array for mechanizing variable integration time per sensor pixel. The photodetector readout cell 900 can be used for processing signal current from each SWIR, MWIR, or LWIR photodetector. Within the ROIC, but peripheral to the M×N array of photodetector readout cell, are ADC circuits, and control circuits used to implement per sensor pixel integration time scaling, and ADC output unscaling as described herein. The per photodetector integration time varies between 1 and 256, in TINT units, and is used for mechanizing very large dynamic range (16-17 bit) with a 9 bit A/D convertor plus unscaling.

Each photodetector readout cell 900 includes: a DI source 910 for accepting photocurrent from a SWIR, or MWIR, or LWIR photodetector and funneling under a DI Gate 912 into a Non-Destructive-Read-Out (NDRO) integration potential well located under a NDRO R/O Well/Gate 920. The charge integration potential well under the NDRO gate 920 can be formed in a n-type buried channel layer where p-type channel stops confine laterally photogenerated charge in the integration well. Charge confinement on the remaining two sides of the integration well is provided by the DI gate 912 and a Blooming/Reset Gate 930. For maximum density and performance, readout of the charge signal in the integration well is with a surface channel PMOS FET with a source node 914 contained in the NDRO structure. For suitable performance, the NDRO has an oval shape. However, a rectangular shape for the NDRO is also viable.

The Blooming/Reset Gate 930 is used to periodically empty signal charge from the potential well under NDRO gate 920 into a Blooming Drain 950. The Blooming/Reset Gate 930 also doubles as an anti-blooming gate which mitigates charge overflow. Readout of signal charge stored in a n-buried potential well under the NDRO gate is with a p-surface channel MOSFET, albeit a conventional readout can also be used. The NDRO's surface p-channel FET operates as a source follower circuit with the p+ source 914 located within the NDRO gate. Output signal at the p-source is produced by the signal charge integrated in the buried potential well (under the NDRO gate 920), which modulates the threshold voltage of the p-surface channel FET with the body effect.

For an M×N FPA staring array each sensor pixel's integrated charge signal is represented by PIX($T_N$ i, j), where "i", "j", and "$T_N$" represent, respectively, row, column, and sensor pixel sample time. The integration time is adjusted (or scaled) according to the sensor pixel's brightness and is made equal to: 1, 4, 16, 64, or 256 TINT time units, represented by a scaling tag G($T_N$, i, j). The five integration times are incremented relative to each other by 4×, and this corresponds to incrementing the noise by 2× within and between the five integration times. The variable integration time feature facilitates digitizing each sensor pixel signals to 17 bits with a 9 bit A/D converter and the scaling tag G($T_N$, i, j) associated with each sensor pixel's brightness PIX($T_N$, i, j). One approach for mechanizing variable integration time per sensor pixel is by reading each sensor pixel in the M×N FPA array five times during the maximum integration period which can equal to 256 time increments in one example. The first reading is read after 1TINT increment, the second reading is after 4TINT increments, the third reading is after 16 TINT increments, the fourth reading is after 64 TINT increments and the fifth (or last reading) is after 256 TINT increments or at the end of the longest integration time. DC offsets and low frequency 1/f noise in the NDRO structure can be removed by initially reading each sensor pixel's output when the integration well under NDRO gate 920 is empty just after the sensor pixel at reset. Subtracting this reading from the sensor pixels signal will remove DC offsets and 1/f noise from the sensor pixel's photosignal.

Each sensor pixel can be readout multiple times within each scene frame and the sample with the optimal integration increment is selected/stored while the others are discarded. Without loss of generality, the total integration time can be divided into 256 units although other totals are possible. Taking consideration of the signal's Poisson statistics, each sensor pixel's integration time is limited to one of five possible increments: 1 TINT unit, 4 TINT units, 16 TINT units, 64 TINT units, and 256 TINT units. Thus, during each scene frame, each sensor pixel is sampled five times with a delay between samples that is consistent with the five increments. Before a sensor pixel is sampled five times, it is first reset and an initial "zero" sample is taken to record DC offsets and low frequency 1/f noise. This "zero" sample is subtracted from each of the five subsequent samples. As with the signals, the integration time for determining the "zero" sample is optimized to minimize noise and maximize sensitivity.

Frame readout of an M×N staring sensor takes several steps which occur after the "zero" sample $PIX(T_N, i, j)$, with the associated scale tag $G(T_N, i, j)$, is taken from each sensor pixel in the array. Thus, during a complete frame readout each sensor pixel can be sampled six times using different integration times. The corresponding sensor pixel's amplitudes are given by: $\{PIX0(T_N,i,j), PIX1(T_N,i,j), PIX4(T_N,i,j), PIX16(T_N,i,j), PIX64(T_N,i,j), \text{ and } PIX256(T_N,i,j)\}$. The associated scale tag for these sensor pixel's amplitude samples are given by: $\{G0(T_N,i,j), G1(T_N,i,j), G4(T_N,i,j), G16(T_N,i,j), G64(T_N,i,j), \text{ and } G256(T_N,i,j)\}$.

Readout of the M×N staring array can be mechanized by the x-y address switches. For example, starting from row 1 and ending with row M. Within each row, for example, "i" all the N columns are sequentially addressed with the x-y address switches. Row "i" is selected by turning on the "NDRO Source Current Enable" at 960 and the "Access to NDRO R/O Enable" switches. For minimum footprint, these currents and some switches can be located on the periphery of the M×N ROIC array. Also, all the sensor pixels' "Blooming/Reset Gate" 920 in the "i" row are enabled to remove all the charge from the NDRO integration well under NDRO gate 920. Signal from all the "j" sensor pixels in the "i" row are measured and digitized to provide the $PIX0(T_N, i, j)$ signals, where, "i" is the row, "j" is the column, and $T_N$ is the time frame's time stamp. The "zero" subscript in $PIX0(T_N,i,j)$ indicates that the signal represents the "zero" calibration output used for removing DC offset and low frequency noise from all the sensor pixels' photosignals. The "zero" calibration signals is measured, digitized, and placed in memory for all the sensor pixels in the M×N array. After completion, "Blooming/Reset Gates" 930 are returned to the anti-blooming level and photocurrent integration starts in the well under NDRO gate 920.

Five (or differing number of samples) variable sensor pixel's integration increment samples can be taken in succession. They are addressed and readout the same way the "zero" calibration samples were obtained; except that during photosignal readout, the integration well under the NDRO gate 920 is collecting charge. Each variable integration increment is taken for the entire array before proceeding to the next integration increment. There are five integration increments per each sensor pixel's output, and these are given by: $PIX0(T_N,i,j), PIX1(T_N,i,j), PIX4(T_N,i,j), PIX16(T_N,i,j), PIX64(T_N,i,j), \text{ and } PIX256(T_N,i,j)$. The subscript represents the variable integration increments. Thus, the integration increment for 1/256 of the frame time is represented by $PIX1(T_N,i,j)$, with the scale tag $G1(T_N,i,j)$. The integration increment 4/256 of the frame time is represented by $PIX4(T_N,i,j)$, with the scale tag $G4(T_N,i,j)$. The integration increment for 16/256 of the frame time is represented by $PIX16(T_N,i,j)$, with the scale tag $G16(T_N,i,j)$. The integration increment for 64/256 of the frame time is represented by $PIX64(T_N,i,j)$, with the scale tag $G64(T_N,i,j)$. The integration increment for 256/256 of the frame time is represented by $PIX256(T_N,i,j)$, with the scale tag $G256(T_N,i,j)$. Data for each integration increment is taken for the entire array. Data for the entire array are taken sequentially, starting with the shortest integration time and proceeding monotonically to the longest integration time increment.

It is noted that with the NDRO, the integrated charge does not have to be reset between different integration increments. Thus, multiple readouts are possible as the signal is being integrated in the well under the NDRO gate 920. Without resets between readouts, the integration time equals to the elapsed time between readout and the time since the well under the NDRO gate was reset to measure the "zero" calibration level. For sufficiently fast frame rates, readout of the M×N array may represent a significant time increment relative to the shorter integration times after which each sensor pixel is readout. This can be resolved by resetting the integration well when the short integration times are significant relative to readout time and, adjusting the value of the scaling tag to compensate for variations in the integration time to compensate for significant readout time.

The first integration increment is selected for shortest integration time which equals to 1/256 of the frame time. Readout of the entire M×N array provides analog data $PIX1(T_N,i,j)$ for each sensor pixel and a scaling tag $G1(T_N,i,j)$. After all the $PIX1(T_N,i,j)$ data are taken, they are digitized, unscaled, the "zero" calibration level subtracted, and the results are stored in memory. The next integration increment equals 4/256 of the frame's integration time. Analog data $PIX4(T_N,i,j)$, with scaling tag $G4(T_N,i,j)$, is taken for the entire M×N array as was used for obtaining the $PIX1(T_N,i,j)$ and $G1(T_N,i,j)$. The $PIX4(T_N,i,j)$ data are digitized, unscaled, the "zero" calibration level subtracted, and the results are stored in memory. This process is repeated for the remaining three integration times: 16/256 of the frame time, 64/256 of the frame time, 256/256 of the frame time. The frame data with the variable integration time per sensor pixel can be optimized by removing DC offsets and low frequency 1/f noise with the "zero" normalization represented by $PIX0(T_N,i,j)$. The NDRO structure provides this feature and this is useful when imaging low level signals, for example.

Figure 10:
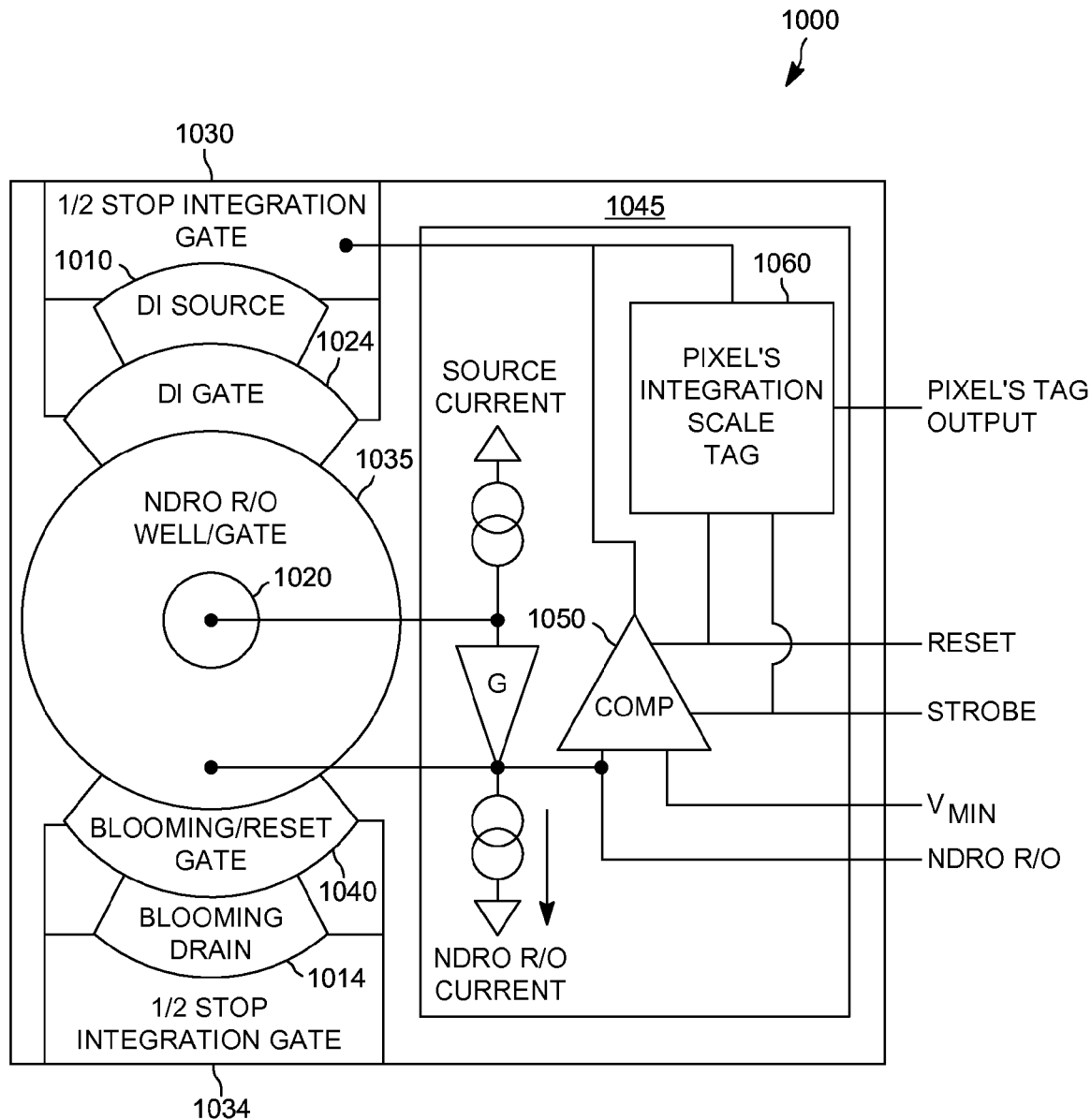
FIG. 10 illustrates an example sensor pixel cell where the optimal integration time for each sensor pixel is determined within each sensor pixel to support fast frame capture rates.

FIG. 10 illustrates an example sensor pixel cell 1000 where each cell of an M×N staring array determines an optimal integration time for the cell to support fast frame capture rates. Imaging at fast frame rates with large staring focal plane arrays can utilize a more elaborate ROIC than described above. Such a ROIC can include sensor pixel readout cells which automatically determine each sensor pixel's optimum integration time; and stop photosignal integration beyond a pixel's optimum integration time. Beyond the optimum integration time, photosignal current is diverted from the sensor pixel's NDRO integration well into a Blooming Drain. Also, within each sensor pixel's readout circuit includes a memory stage which records which one of the five possible integration times is selected as optimum.

The cell 1000 automatically adjusts the integration time within each sensor pixel's readout cell to maximize the frame rate at which scenes are captured with large area staring focal plane arrays. This can be achieved since each sensor pixel's readout cell architecture minimizes the number of ADC operations applied to each sensor pixel one (or two if dc offset and 1/f noise cancellation is used). Additionally, the sensor pixel's integration times are synchronized because all the sensor pixels are operating independently in parallel. Before describing the operation the sensor pixel readout cell 1000, the various circuits in the sensor pixel's readout and their function are described.

A DI Source 1010 is connected to the photodetector and operates as a "virtual ground" thereby letting the photocurrent generated by the photodetector to flow into the integration well under NDRO's R/O Well/Gate 1035, and the amount of integrated charge is limited by Blooming/Reset gate 1040 and drains into Blooming Drain 1014. The NDRO R/O Well/Gate 1035 serves two functions. First it controls the potential of a well underneath in which the signal charge is integrated, and second it is serves as gate for the p-surface channel used to non-destructively sense the signal charge integrated in the well located beneath the NDRO Gate 1035.

A Direct Injection (DI) Gate 1024 is biased at a potential for optimizing the operation of the photodetector connected to the DI Source 1010 and allows signal charge injected into the DI Source to flow beneath it and into the integration well under the NDRO gate 1035. A stop Integration Gate is shown in two halves at 1030 and 1034. This indicates that when the pixel readout cells are assembled into a two dimensional x-y array, the two halves of this gate are joined together in the interior of the array into a single gate adjacent to the Blooming Drain 1014 which serves two sensor pixels. At the x-y array periphery structures are added to make the sensor pixel readout cell on the periphery the same as the interior cell. When the Stop Integration Gate 1030/1034 is biased blocking, the photodetector's signal is injected into the DI source and it flows the integration well located under the NDRO gate 1035. When the Stop Integration Gate 1030/1034 is biased as non-blocking by the sensor pixel's readout circuit, the photogenerated signal flows from the DI source 1010 into the Blooming drain 1014. The function of the Stop Integrate Gate 1030/1034 is to control the length of the sensor pixels' integration time to: 1TINT 4TINT, 16TINT, 64TINT, and 256TINT, for example, according to the transformation methods described herein.

The Integration Well is located beneath the NDRO R/O Well/Gate 1035 and its function is to provide a potential well into which the charge signal injected into the DI Source 1010 and flowing under the DI Gate 1024 is integrated. The NDRO structure 1000 uses the potential well with the integrated signal charge inside to modulate the surface potential under the NDRO R/O Well/Gate 1035 using the body effect. The NDRO includes a surface channel FET (concentric with the potential well) with the source located in the center of the NDRO Gate 1035 and the p-surface channel formed from channel stops 1045 located around the left and right sides of the NDRO Gate 1035. The surface channel FET's Drain can surround the source located in the NDRO's gate center by biasing the DI Gate 1024 and Blooming/Reset Gate 1040 into inversion. However, this is not necessary to the proper operation of the NDRO R/O structure.

The blooming/Reset Gate 1040 is used to limit the amount of charge integrated inside the integration well under the NDRO gate 1035 according to the blocking potential applied to this gate. Excess charge is drained into the Blooming Drain 1014. When pulsed non-blocking, the Blooming/Reset Gate 1040 empties the charge integrated in integration well under the NDRO gate 1035 into the Blooming Drain 1014. The Blooming Drain 1014 provides a dc potential node which is used to remove charge from within the sensor pixel's readout circuit. An amplifier shown with gain G<1 has its input connected to the surface channel FET's source 1020 and output connected to the NDRO's R/O Well/Gate 1035. The surface channel FET operates with the source follower mode where it senses the charge integration in the well under the NDRO gate 1035 by the body effect (or back gate effect), wherein the charge integrated in the integration well under the NDRO gate 1035 modulates the surface potential of the p-channel FET. The amplifier, operating in a feedback mode, increases this body (back gate modulation) effect by increasing the coupling between charge integrated in the well under the NDRO gate and the FET's surface p-channel. A ten-fold increase in coupling (sensitivity) can be realized and it depends on the gain G<1 of the amplifier. The less than unity gain amplifier circuit can be, for example, a source follower, or a single ended or differential feedback amplifier with gain less than one. One amplifier example assumes a source follower with the source current supplied with the NDRO R/O Current. The NDRO's output node is connected to the amplifier's output and labeled NDRO R/O.

A comparator 1050 has four inputs and one output. The comparator 1050 compares the NDRO R/O voltage signal with a predetermined threshold VMIN, a reference voltage which represents the minimum value of charge Signal Range 1 (See FIG. 11). The two additional inputs are a Strobe and a Reset. The Reset is used to initialize the comparator's output to the "Off" state so that Stop Integration Gate is blocking, and the Sensor pixel's Integration Tag block is enabled. The Strobe input enables/disables the comparator's 1050 operations. The comparator 1050 is enabled by the Strobe input and compares the NDRO R/O output voltage to the VMIN voltage. When the NDRO R/O output voltage represents more integrated charge in the NDRO Integration Well than the charge signal associated with VMIN, the comparator's output latches into an "On" state and remains there until it is reset by the Reset input. This comparison is true if the staring sensor focal plane is imaging with photogenerated holes or electrons. Polarity adjustments are made in the comparisons circuits to insure proper operation.

A Sensor pixel's Integration Tag block 1060 has three inputs (Comp, Strobe, and Reset) and one output sensor pixel's Tag Output. The function of the sensor pixel's Integration Tag block 1060 is to determine the sensor pixel's Scale Tag during each frame. At the beginning of each frame (before charge integration starts) the Reset input initializes the sensor pixel's Scale Tag block 1060 and prepares for recording the sensor pixel's Scale Tag in the next frame. The Strobe input counts how many times within a frame the Comparator 1050 was enabled and this count represents the value of sensor pixel's Scale Tag. When the comparator output is latched into the "On" state, the counting circuit in the sensor pixel's Integration Scale Tag is latched and does not count until it is reset occurring at the beginning of the frame.

For minimum noise, it is desirable at the beginning of a new frame to measure the value of the dc offsets and 1/f noise associated with each sensor pixel's readout circuit. This measurement requires: (1) emptying the integration well located under the NDRO gate 1035 of any charge signal, and (2) prevent any photosignal from being injected in the NDRO Integration Well. Latching the comparator 1050 in the "On"

state by momentarily pulsing VMIN enables the Stop Integration Gate and prevents any photogenerated charge form integrating in the Integration Well under NDRO gate 1035. Charges from the Integration Well under NDRO gate 1035 are emptied into the Blooming Drain 1014 when the Blooming/Reset Gate is pulsed non-blocking. Each sensor pixel's PIX0 (TN,i,j) signal is obtained at the NDRO R/O node signal and it is digitized thereby recording sensor pixel's the dc offset and 1/f noise value. The recorded dc offsets and 1/f noise values are subtracted from the NDRO R/O signal the sensor pixel produces during each frame.

The charge signals integrated in each sensor pixel are obtained at the end of a frame by sampling each sensor pixel's readout circuit output PIX0($T_N$,i,j) at the NDRO R/O node, see FIG. 10. After the dc offset and 1/f noise values are recorded, a reset pulse is applied to reset the sensor pixel's Integration Scale Tag block 1060, and the comparator 1050. This action resets count in the Sensor pixel's Integration Scale Tag block 1060 and the comparator output, which turns off the Stop Integration Gate 1030/1034 and enables charge flow from the DI Source 1010 into the integration well under the NDRO gate 1035. In parallel, the Blooming/Reset Gate 1040 is biased into the anti-blooming mode. During the charge integration process, the comparator is strobed five times (consistent with the examples described herein).

The first Strobe pulse is applied at TINT and the comparator output examined if the number of charges integrated in the NDRO Integration Well is larger than the minimum number of charges in Signal Range 1 (SR#1) described above. Voltage VMIN is adjusted to compensate for the charge-to-voltage gain of the NDRO R/O circuit, and the input connections to the comparator 1050 are adjusted to be consistent with polarity of a hole or electron charge signals. The comparator 1050 remains in the "Off" (latches into the "On") state if the number of charges integrated in the well under the NDRO gate 1035 is smaller (larger) than the number of charges associated with VMIN. If the comparator output latches into the "On" state: (1) it biases the Stop Integration Gate 030/1034 to prevent additional charge signal from integration in the NDRO Integration Well, and (2) the sensor pixel's Integration Scale Tag Block sensor pixel's Tag Output increments to "One". The comparator 1050 and the sensor pixel's Integration Scale Tag block are placed in a latched position and remain in this state until reset by a reset pulse in the next frame. If the Comp output remains in the "Off" state: (1) signal charge continues to integrate in the NDRO Integration Well, and (2) the sensor pixel's Integration Scale Tab block increments to "One". The sensor pixel's Integration Scale Tag Block and comparator stage remain unlatched.

At the second Strobe pulse applied at time 4TINT, nothing changes if the comparator and Integration Scale Tab Block were latched during the first Strobe pulse. If the comparator stage remains unlatched at the end of the first Strobe pulse, the Comp remains in the "Off" (latches into the "On") state if the number of charges in the NDRO Integration Well is smaller (larger) than the number of charges associated with VMIN. If the comparator output latches into the "On" state: (1) it biases the Stop Integration Gate 1030/1034 to prevent additional charge signal from integration in the integration well under the NDRO gate 1035, and (2) the sensor pixel's Integration Scale Tag block sensor pixel's Tag Output increments from "One" to "Two". The comparator 1050 and the sensor pixel's Integration Scale Tag block 1060 are placed in a latched position and remain in this state until reset by a reset pulse in the next frame. If the Comp output remains in the "Off" state: (1) signal charge continues to integrate in the integration well under the NDRO gate 1035, and (2) the sensor pixel's Integration Scale Tag block increments from "One" to "Two". The sensor pixel's Integration Scale Tag Block and comparator stage remain unlatched.

At the third Strobe pulse applied at time 16TINT, nothing changes if the comparator 1050 and Integration Scale Tab block 1060 were latched during earlier Strobe pulse(s). If the Comp stage was unlatched at the end of the second Strobe pulse, the comparator remains in the "Off" (latches into the "On") state if the number of charges in the NDRO Integration Well is smaller (larger) than the number of charges associated with VMIN. If the Comp output latches into the "On" state: (1) it biases the Stop Integration Gate to prevent additional charge signal from integration in the integration well under the NDRO gate 1035, and (2) the sensor pixel's Integration Scale Tag Block sensor pixel's Tag Output increments from "Two" to "Three". The comparator 1050 and the sensor pixel's Integration Scale Tag Block 1060 are placed in a latched position and remain in this state until reset by a reset pulse in the next frame. If the Comp output remains in the "Off" state: (1) signal charge continues to integrate in the integration well under the NDRO gate 1035, and (2) the sensor pixel's Integration Scale Tab Block increments from "Two" to "Three". The sensor pixel's Integration Scale Tag Block and Comp stage remain unlatched.

At the fourth Strobe pulse applied at time 64TINT, nothing changes if the comparator 1050 and Integration Scale Tab Block 1060 were latched during earlier Strobe pulse(s). If the Comp stage was unlatched at the end of the third Strobe pulse, the comparator remains in the "Off" (latches into the "On") state if the number of charges in the integration well under the NDRO gate 1035 is smaller (larger) than the number of charges associated with VMIN. If the comparator output latches into the "On" state: (1) it biases the Stop Integration Gate to prevent additional charge signal from integration in the integration well under the NDRO gate 1035, and (2) the sensor pixel's Integration Scale Tag Block sensor pixel's Tag Output increments from "Three" to "Four". The comparator 1050 and the sensor pixel's Integration Scale Tag Block 1060 are placed in a latched position and remain in this state until reset by a reset pulse in the next frame. If the comparator output remains in the "Off" state: (1) signal charge continues to integrate in the integration well under the NDRO gate 1035, and (2) the sensor pixel's Integration Scale Tab Block increments from "Three" to "Four". The sensor pixel's Integration Scale Tag Block and comparator remain unlatched.

At the fifth Strobe pulse is applied at time 256TINT nothing changes if the comparator 1050 and Integration Scale Tab Block 1060 were latched during earlier Strobe pulse(s). If the comparator stage was unlatched at the end of the fourth Strobe pulse, the comparator remains in the "Off" (latches into the "On") state if the number of charges in the integration well under the NDRO gate 1035 is smaller (larger) than the number of charges associated with VMIN. If the comparator output latches into the "On" state: (1) it biases the Stop Integration Gate to prevent additional charge signal from integration in integration well under the NDRO gate 1035, and (2) the sensor pixel's Integration Scale Tag Block sensor pixel's Tag Output increments from "Four" to "Five". The comparator and the sensor pixel's Integration Scale Tag Block are placed in a latched position and remain in this state until reset by a reset pulse in the next frame. If the Comp output remains in the "Off" state: (1) signal charge continues to integrate in the integration well under the NDRO gate 1035, and (2) the sensor pixel's Integration Scale Tab block increments from "Four" to "Five". The sensor pixel's Integration Scale Tag Block and comparator stage remain unlatched.

After completion of the fifth strobe pulse, the NDRO R/O and associated sensor pixel's Tag outputs from every sensor pixel's readout circuit are digitized with a nine bit ADC. The digital outputs are unscaled using the sensor pixel's Tag which represents gain scaling applied to the sensor pixel. The sensor pixel's Tag Output of "One", "Two", "Three", "Four", and "Five" correspond to the a scale factor 1, 4, 16, 64, and 256, respectively. The digitization and unscaling is shown in FIGS. 3 and 4.

Figure 11:
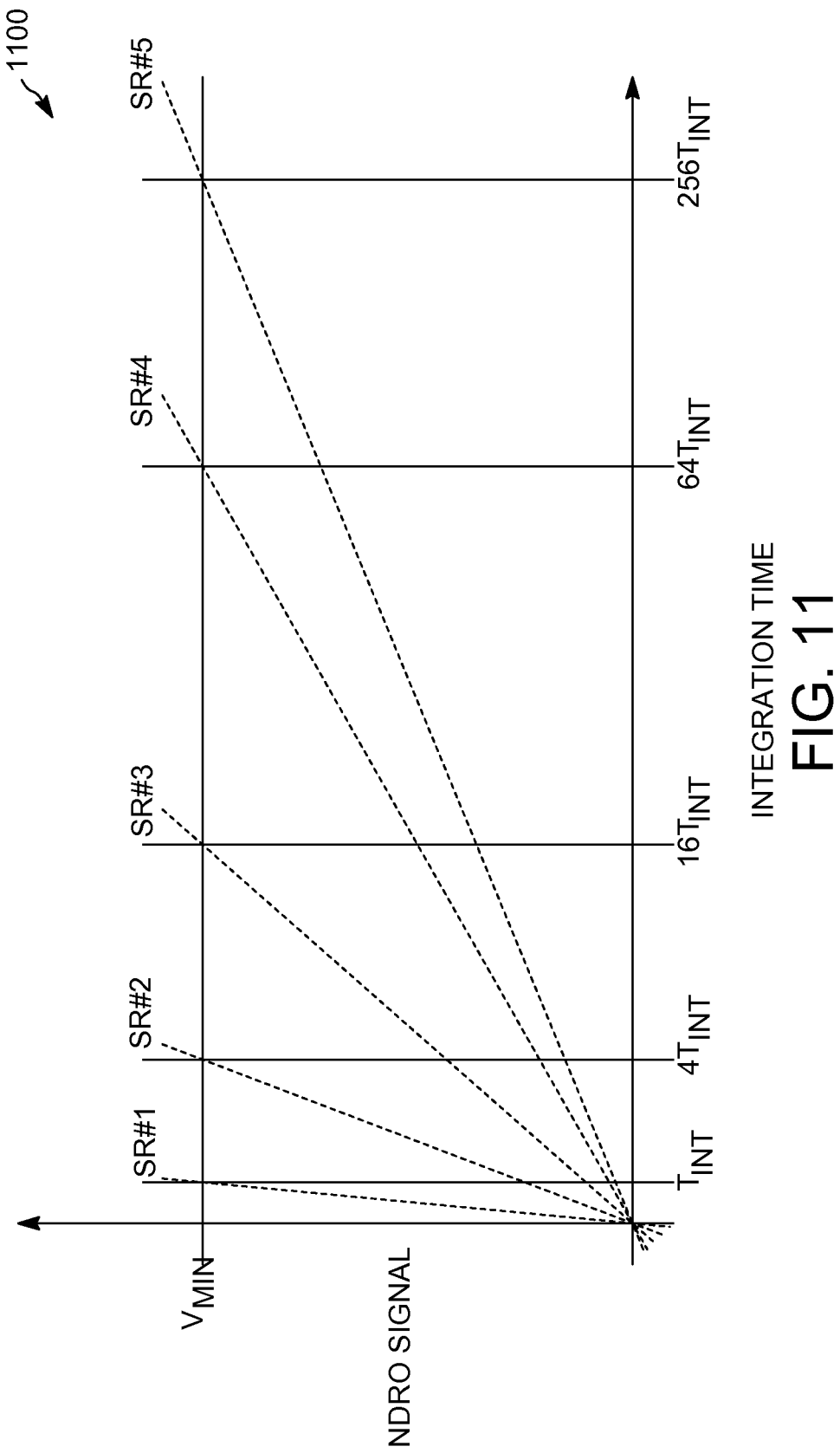
FIG. 11 illustrates an example of sensor pixel's signal levels expected for the example depicted in FIG. 10.

FIG. 11 illustrates an example sample diagram 1100 for the example sensor pixel cell depicted in FIG. 10. The NDRO output signal shown above with respect to FIG. 10 is represented by five diagonal lines corresponding to sensor pixels signals exposed to different brightness signals. The five curves are tagged by SR#1, SR#2, SR#3, SR#4, and SR#5, and these represent the Signal Ranges 1, 2, 3, 4, and 5 (shown in Table 3). The threshold voltage VMIN is the minimum voltage level measured at the NDRO output. Scaling the integration time by 1×, 4×, 16×, 64× and 256× equalizes the minimum voltage levels VMIN in the five Signal Ranges. As noted above, if after an integration period, a saturation level is detected in the comparator when comparing VMIN to the detected cell voltage, the value of the previous integration period is saved as the scaling value for the given cell. Thus, if after a 4th integration period, a saturation was detected in the 4th period, then the value of 3 would be saved in the scaling block representing the longest integration time without saturation.

Figure 12:
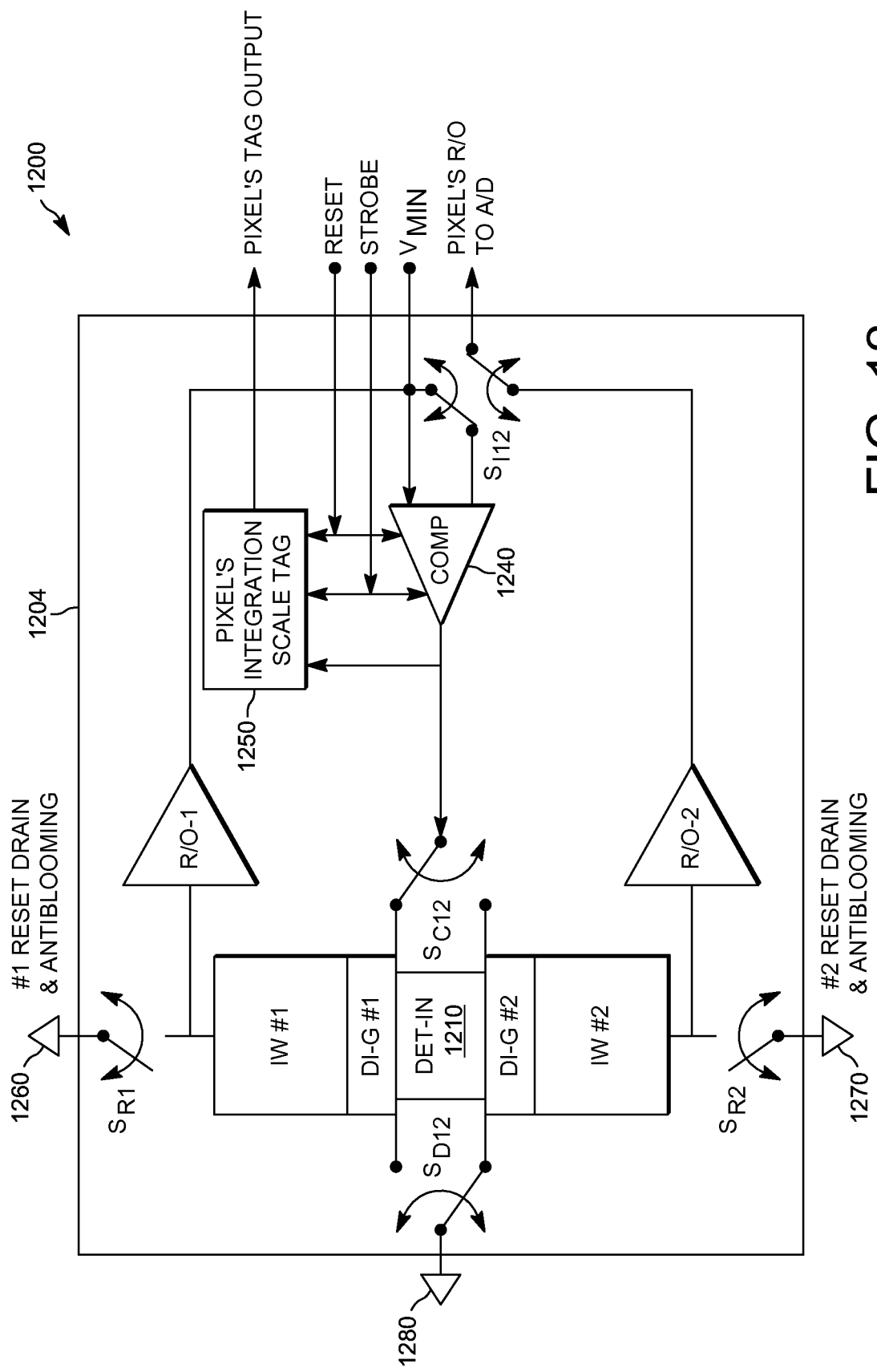
FIG. 12 illustrates, within a pixel, an example of a multiple integration well architecture that enables concurrent signal integration and readout to maximize the integration duty cycle and readout for a pixel.

FIG. 12 illustrates, within a pixel, an example of a multiple integration well architecture 1200 that enables concurrent signal integration and readout to maximize the integration duty cycle and readout for a pixel. As used herein, the term acquisition refers to when, within a pixel, one integration cell of the architecture 1200 is acquiring (by integration) new photonic charge during a present frame, and concurrently charge integrated within the pixel during the previous frame is readout (including digitization). The term readout refers to when at least one other integration cell of the architecture 1200, with integrated photonic charge from a previous frame, is readout (including digitization). With two integration wells per pixel, each integration well in readout mode maximizes the throughput for a given pixel of the M×N sensors described herein.

In this example, a starring pixel's sensor readout cell 1204 (also referred to as a pixel) includes at least two integration wells IW #1 and IW #2, which maximizes the pixel's duty cycle by operating in a switching manner. Each integration well, IW #1 and IW#2, is associated with a separate readout buffer shown as R/O-1 and R/O-2, respectively. A single detector input at 1210 is switched via switches $S_{D12}$ and $S_{C12}$ between each integration well, IW #1 and IW#2, as the wells cycle between being in the integration or readout mode. Gate inputs DI-G #1 and DI-G #2 enable IW #1 and IW#2 to capture photonic charge when the detector input 1210 is switched to the respective well during acquisition (integration) mode for the well.

Each pixel's output is obtained via readout buffer, R/O-1 or R/O-2, as one of these switched into readout mode via switch $S_{f12}$ and the other operates in acquisition mode. During readout, a pixel's output signal from R/O-1 or R/O-2 is sent to an A/D (not shown) to be digitized via $S_{f12}$ Also, $S_{f12}$ represents a dual function switch where the well that is not being readout is allowed to integrate and store photonic charge for the present for readout in the next frame. A comparator 1240 and scale tag circuit 1250 are employed to facilitate integration of the photonic charge into IW#1 (or IW#2) when photonic charge from IW#2 (or IW#1) is readout with R/O-2 (or R/O-1) during alternate frames. Nodes shown at 1260 and 1270 provide paths for reset and anti-blooming functions that have previously been described herein. Node 1280 provides a blocking potential which prevents integration of additional photonic charge into IW#2 (or IW#1) during a frame when IW#2 (or IW#1) is readout with R/O-1 (R/O-2).

In a switching operation from one frame to the next, one of the integration wells IW #1 or IW#2 is used for charge integration while the other of the integration wells is used for reading out and digitizing charges integrated in a previous frame. In the next frame, the roles of IW#2 and IW#1 are reversed and as such switching occurs with every new frame. Thus, during each frame period, each pixel supports two parallel operations.

One operation is performed with one integration well wherein the pixel's optimal integration time is applied with each pixel's processing circuit as described herein. Each pixel's processing circuit is used for determining/adjusting the pixel's optimal charge integrating time for said integration well and recording this integrating time with the scaling tag circuit 1250. The integration time should be less than or equal to the to the frame time, and can be selected out of five selections listed in Table 3 above, for example.

A second operation or mode concurrently is used to digitize the signal in the second integration well, which was integrated during the previous frame. Thus, at the beginning of each new frame readout occurs concurrently of the well used to integrate the photosignal in the previous frame: the contents of the scaling tag circuit 1250 are downloaded, the integration well's signal is connected to and digitized by a scaling A/D converter (not shown).

Each pixel 1204 includes circuits for maximizing the pixels' exposure time for a given frame rate. This is achieved by adding at least one other charge integration well with switches and a second R/O to operate the pixel's scale integration circuit 1250. This configuration also provides for DC offset cancellations and removal of low frequency 1/f noise, for example. Optimizing each pixel's exposure overcomes potential limitations of a single exposure for every pixel, which can limit imaging of scenes with large dynamic ranges. The circuit 1204 maximizes the dynamic range of a focal plane sensor by adjusting the exposure time for each pixel, equalizes the S/N ratio within 2× for pixels imaging bright, average and dim scene portions, and simplifies the A/D digitization of the analog signals from the focal plane by utilizing an equalizing S/N ratio Digital Transformation, which maximizes each pixel's exposures for a given frame rate.

Figure 13:
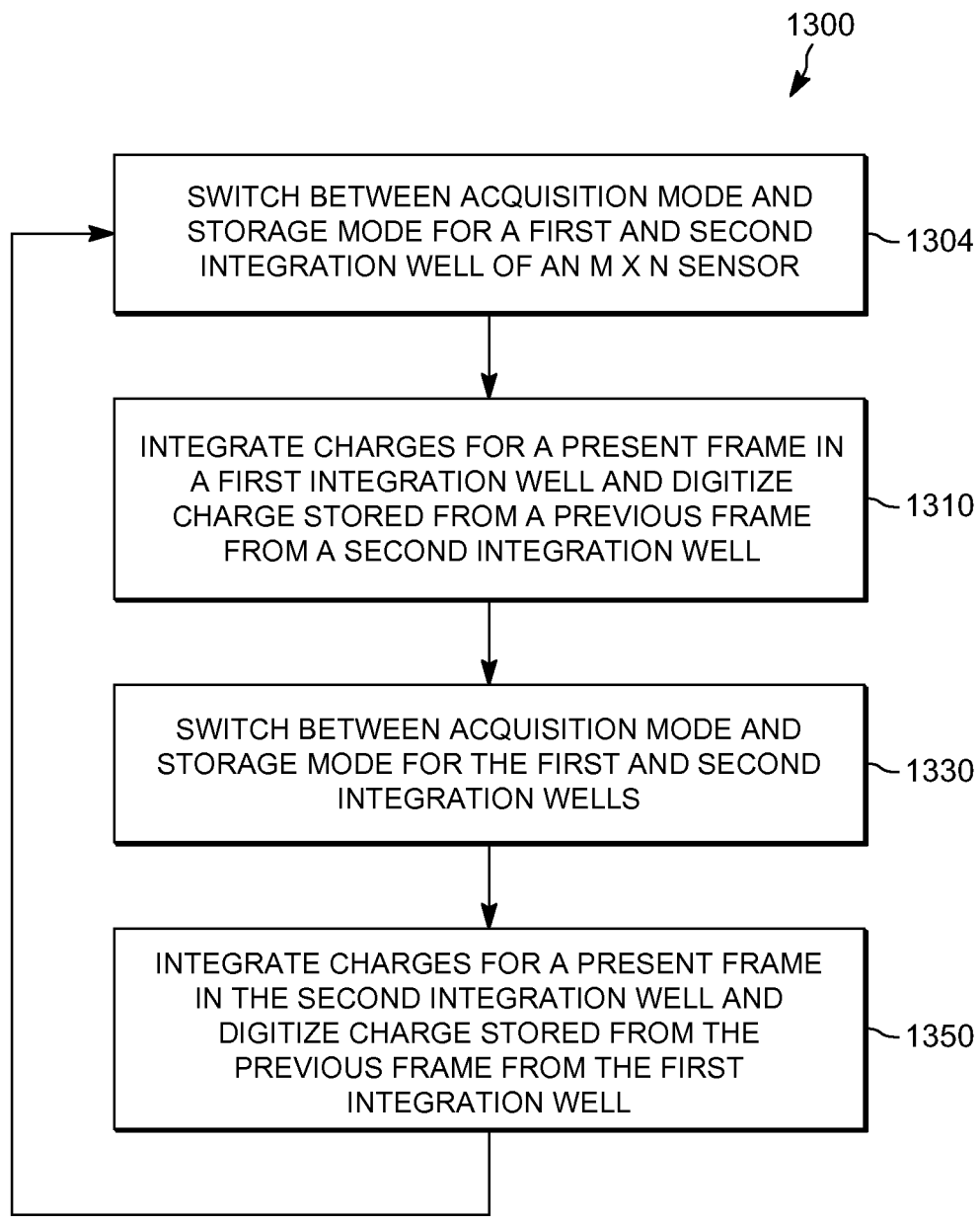
FIG. 13 illustrates a method that enables pixel sampling and readout on alternative cycles to maximize the duty cycle throughput for a pixel.

FIG. 13 illustrates a method 1300 that enables pixel sampling and readout on alternative cycles to maximize the duty cycle throughput for a pixel. At 1304, the method 1300 includes switching a first integration well for an M×N sensor to acquisition mode while switching a second integration well for the M×N sensor to readout mode. At 1310, the method 1300 includes integrating charges for a present frame in the first integration well and digitizing charges stored from a previous frame from the second integration well while the present frame is acquired in the first integration well. At 1330, the method 1300 includes switching the first integration well to readout mode and the second integration well to acquisition mode. At 1350, the method 1300 includes integrating charges for the present frame in the second integration well and digitizing charges stored from the previous frame from the first integration well while the present frame is acquired in the first integration well.

At 1310 and 1350, the method 1300 can also include integrating charges by optimizing or scaling their integration time based on a histogram of initial photosignal values to determine an overall dynamic signal range and signal subranges which enable mapping each initial photosignal value to a scaled value into a same photosignal value range. The method 1300 can also include using an integration time selected scale factor for integrating charge of each sensor pixel of the M×N sensor. The method 1300 also can include alternating the first integration well between acquisition mode and readout mode while the second integration well is alternated between readout mode and acquisition mode respectively.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations.

What is claimed is:

1. A focal plane staring sensor comprising:
   an M×N sensor, where M is a number of rows of sensor pixels in the sensor and N is a number of columns of sensor pixels in the sensor, where M and N are integers greater than one, wherein the M×N sensor employs at least two integration wells to acquire photonic charge for each sensor pixel for a present frame and to store photonic charge for each sensor pixel from a previous frame; and
   a control circuit that samples a sensor pixel value for each sensor pixel of the M×N sensor at a plurality of different integration times corresponding to an amount of time that the photonic charge can be acquired in each sensor pixel of the M×N sensor, wherein the control circuit selects one sample from a set of samples to generate a scaled value to facilitate an equalization of a signal to noise ratio between the sensor pixels, wherein the control circuit switches between the at least two integration wells of the M×N sensor to acquire photonic charge for the present frame in one of the at least two integration wells and to enable readout of the stored photonic charge from the previous frame from the other of the at least two integration wells.

2. The focal plane staring sensor of claim 1, further comprising at least one readout circuit configured to enable the photonic charge in each sensor pixel of the M×N sensor to be acquired during the present frame and to generate a readout signal for each sensor pixel representing the photonic charge acquired in each sensor pixel during the previous frame.

3. The focal plane staring sensor of claim 2, wherein the at least one readout circuit includes an integrated comparator to enable and disable sample integration times on the M×N sensor and a scale tag circuit to store a scaling tag for each sensor pixel for the present frame of the M×N sensor.

4. The focal plane staring sensor of claim 3, wherein the comparator compares pixel output from the M×N sensor to a predetermined threshold voltage to determine an optimum sample time.

5. The focal plane staring sensor of claim 1, wherein the control circuit determines a scale factor for each sensor pixel, based on an a histogram of initial photosignal values, and is used to determine an overall dynamic signal range and signal subranges which enable mapping each initial photosignal value to a scaled value into a same photosignal value range, using an integration time selected scale factor for integrating charge of each sensor pixel.

6. The focal plane staring sensor of claim 5, further comprising an unscaling circuit that that unscales the scaled value by shifting the scaled value according to the scale factor.

7. The focal plane staring sensor of claim 6, further comprising a detector input to receive photonic charge for the at least two integration wells.

8. The focal plane staring sensor of claim 7, further comprising at least two detector input gates to provide photonic charge from the detector input to the at least two integration wells.

9. A focal plane staring sensor comprising:
   an M×N sensor, where M is a number of rows of sensor pixels in the sensor and N is a number of columns of sensor pixels in the sensor, where M and N are integers greater than one, wherein the M×N sensor employs at least two integration wells to acquire photonic charge for each sensor pixel for a present frame and to store photonic charge for each sensor pixel from a previous frame; and; and
   a control circuit that samples a sensor pixel value for each sensor pixel of the M×N sensor at a plurality of different integration times corresponding to an amount of time that a photonic charge can be acquired in each sensor pixel of the M×N sensor, wherein the control circuit determines a scale factor for each sensor pixel, based on an initial photosignal value, and maps each initial photosignal value to a scaled value into a same photosignal value range, the scale factor determines an integration time selected for integrating charge of each sensor pixel, wherein the control circuit switches between the at least two integration wells of the M×N sensor to acquire photonic charge for the present frame in one of the at least two integration wells and to enable readout of the stored photonic charge from the previous frame from the other of the at least two integration wells.

10. The focal plane staring sensor of claim 9, further comprising at least one readout circuit configured to enable the photonic charge in each sensor pixel of the M×N sensor to be acquired during the present frame and to generate a readout signal for each sensor pixel representing the photonic charge acquired in each sensor pixel during the previous frame.

11. The focal plane staring sensor of claim 10, wherein the at least one readout circuit includes an integrated comparator to enable and disable sample integration times on the M×N sensor and a scale tag circuit to store a scaling tag for each sensor pixel for the present frame of the M×N sensor.

12. The focal plane staring sensor of claim 11, wherein in each pixel a comparator compares the pixel's output from the M×N sensor to a predetermined threshold voltage to determine an optimum sample time.

13. The focal plane staring sensor of claim 9, wherein in each pixel the control circuit determines a scale factor for each sensor pixel, based on an a histogram of initial photosignal values, and is used to determine an overall dynamic signal range and signal subranges which enable mapping each initial photosignal value to a scaled value into a same photosignal value range, using an integration time selected scale factor for integrating charge of each sensor pixel.

14. The focal plane staring sensor of claim 13, further comprising an unscaling circuit that unscales the scaled value by shifting the scaled value according to the scale factor.

15. The focal plane staring sensor of claim 9, further comprising a pixel with a detector input to receive photonic charge and selectively channel it to at least two integration wells.

16. The focal plane staring sensor of claim 15, further comprising a pixel with at least two detector input gates to selectively channel photonic charge from the detector input to the at least two integration wells.

17. A method comprising:
switching within a sensor pixel a first integration well within an M×N sensor to acquisition mode and a second integration well within each sensor pixel in the M×N sensor to readout mode;
integrating charges within each sensor pixel for a present frame in the first integration well and digitizing charges stored from a previous frame from the second integration well;
switching within each sensor pixel the first integration well to readout mode and the second integration well to acquisition mode; and
integrating charges within each sensor pixel charges for the present frame in the second integration well and digitizing charges stored in each sensor pixel from the previous frame from the first integration well.

18. The method of claim 17, further comprising in each sensor pixel alternating the first integration well between acquisition mode and readout mode while the second integration well is alternated between readout mode and acquisition mode respectively.

19. The method of claim 17, further comprising in each sensor pixel scaling charges acquired for the present frame based on a histogram of initial photosignal values to determine an overall dynamic signal range and signal subranges which enable mapping each initial photosignal value to a scaled value into a same photosignal value range.

20. The method of claim 19, using in each sensor pixel an integration time selected scale factor for integrating charge of each sensor pixel of the M×N sensor.

* * * * *